(12) United States Patent
Hasei

(10) Patent No.: US 7,282,779 B2
(45) Date of Patent: Oct. 16, 2007

(54) DEVICE, METHOD OF MANUFACTURE THEREOF, MANUFACTURING METHOD FOR ACTIVE MATRIX SUBSTRATE, ELECTRO-OPTICAL APPARATUS AND ELECTRONIC APPARATUS

(75) Inventor: Hironori Hasei, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 245 days.

(21) Appl. No.: 10/849,858

(22) Filed: May 21, 2004

(65) Prior Publication Data

US 2005/0042320 A1 Feb. 24, 2005

(30) Foreign Application Priority Data

May 30, 2003 (JP) ............... 2003-155863
Apr. 9, 2004 (JP) ............... 2004-115372

(51) Int. Cl.
*H01L 21/762* (2006.01)
(52) U.S. Cl. ............... 257/520; 257/E23.166; 349/149
(58) Field of Classification Search ............... 257/520, 257/E23.166; 349/149
See application file for complete search history.

(56) References Cited

U.S. PATENT DOCUMENTS

| | | | |
|---|---|---|---|
| 5,519,524 A * | 5/1996 | Fergason et al. ............ | 349/149 |
| 6,524,876 B1 | 2/2003 | Baek et al. | |
| 6,630,274 B1 | 10/2003 | Kiguchi et al. | |
| 6,734,029 B2 | 5/2004 | Furusawa | |
| 6,852,524 B2 | 2/2005 | Okamura et al. | |
| 6,887,631 B2 | 5/2005 | Kiguchi et al. | |
| 7,068,247 B2 | 6/2006 | Nakanishi | |
| 7,070,890 B2 | 7/2006 | Kiguchi et al. | |
| 2003/0060038 A1 * | 3/2003 | Sirringhaus et al. ........ | 438/637 |

FOREIGN PATENT DOCUMENTS

| | | |
|---|---|---|
| EP | 0 989 778 A1 | 3/2000 |
| JP | B2 8-12294 | 2/1996 |
| JP | A 9-203803 | 8/1997 |
| JP | A 9-230129 | 9/1997 |
| JP | A 10-186412 | 7/1998 |
| JP | A 10-282321 | 10/1998 |
| JP | A 11-274671 | 10/1999 |
| JP | A 2000-187111 | 7/2000 |
| JP | A 2000-208881 | 7/2000 |
| JP | A 2000-216330 | 8/2000 |
| JP | A 2000-353594 | 12/2000 |
| JP | A-2001-66408 | 3/2001 |
| JP | A 2001-276726 | 10/2001 |
| JP | A 2001-291583 | 10/2001 |
| JP | A 2001-353973 | 12/2001 |
| JP | A 2002-164635 | 6/2002 |
| JP | 2003-14760 | 1/2003 |
| JP | A 2003-36040 | 2/2003 |
| JP | 2003-233329 | 8/2003 |
| JP | 2003-241685 | 8/2003 |
| KR | A 2001-0009269 | 2/2001 |
| WO | WO99/48339 | 9/1999 |
| WO | WO-02/099477 A1 | 12/2002 |

* cited by examiner

*Primary Examiner*—Asok Kumar Sarkar
(74) *Attorney, Agent, or Firm*—Oliff & Berridge, PLLC

(57) ABSTRACT

A device includes banks formed on a substrate, a conducting film formed by droplet ejection onto a predetermined pattern formation region in a groove between the banks, and a second conductive film formed by droplet ejection disposed outside the pattern formation region and electrically separated from the conductive film.

12 Claims, 14 Drawing Sheets

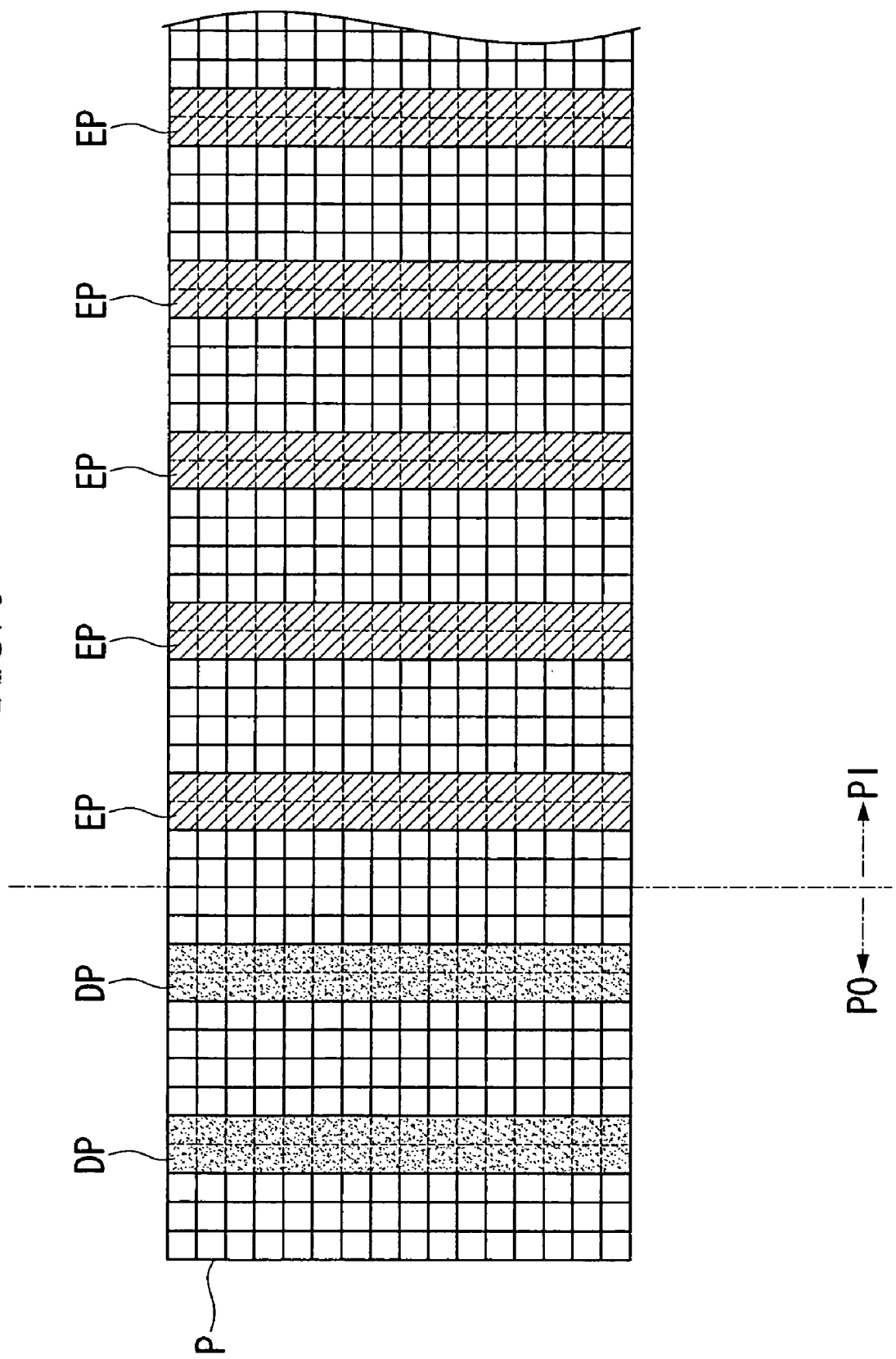

DEVICE, METHOD OF MANUFACTURE THEREOF, MANUFACTURING METHOD FOR ACTIVE MATRIX SUBSTRATE, ELECTRO-OPTICAL APPARATUS AND ELECTRONIC APPARATUS

BACKGROUND OF THE INVENTION

1. Field of the Invention

The present invention relates to a device and a method of manufacture thereof, a manufacturing method for an active matrix substrate, and an electro-optical apparatus and an electronic apparatus.

Priority is claimed on Japanese Patent Application No. 2003-155863, filed May 30, 2003, and Japanese Patent Application No. 2004-115372, filed Apr. 9, 2004, the contents of which are incorporated herein by reference.

2. Description of Related Art

Conventionally, photolithographic methods are generally used as a manufacturing method for a fine wiring pattern such as a semiconductor integrated circuit. For example, Japanese Unexamined Patent, First Publication No. H11-274671 and Japanese Unexamined Patent, First Publication No. 2000-216330 disclose a method in which a droplet ejection technique is used. The technology disclosed in these publications form a wiring pattern by distributing (coating) a material on the pattern formation surface by ejecting a functional liquid that includes a pattern formation material onto the substrate from a droplet ejection head, and are very effective in being applicable to many types of small scale production.

In recent years, the density of the circuits that form devices has become higher, and for example, wiring patterns must become increasingly finer and narrower.

However, in the case that this type of fine wiring pattern is formed by using a method that employs the droplet ejection technique described above, attaining a sufficiently precise wiring width is particularly difficult. Thus, for example, Japanese Unexamined Patent, First Publication No. H09-203803 and Japanese Unexamined Patent, First Publication No. H09-230129 disclose a technology in which banks that function as partition members are provided on the substrate, and at the same time, surface processing is applied in order to make the upper part of the banks liquid repelling and the other parts thereof liquid attracting.

By using this type of technology, it is possible to form fine wiring by defining the width of the wiring pattern even for fine wiring by the width between the banks.

However, in the conventional technologies described above, the following types of problems are present.

Although the ink coating using the droplet ejection technique can eject and apply at a high resolution droplets having a diameter on the μm order, the micro droplets that coat the substrate dry extremely quickly, and furthermore, at the edges (upper edge, lower edge, right edge, and left edge) in the coated areas on the substrate, the partial pressure of the solvent molecules (the solvent vapor density) vaporizing from the micro droplets is low, and thus generally drying starts quickly.

This difference in drying times of the liquid applied in the substrate in this manner causes irregularities in the thickness of the conductive film wiring. In addition, this irregularities in the film thickness invite such problems as unevenness in the conductivity and electrical properties.

In consideration of the problems described above, it is an object of the present invention to provide a device and a method of manufacture thereof that does not produce irregularities in the film thickness and can eliminate unevenness in the electrical properties, a manufacturing method for an active matrix substrate, an electro-optical apparatus, and an electronic apparatus.

SUMMARY OF THE INVENTION

The first aspect of the present invention is a device, and provides a substrate, banks formed on the substrate, a conductive film formed by droplet ejection on a predetermined pattern formation region in grooves between the banks, and a second conductive film that is disposed outside the pattern formation region, is electrically separated from the conductive film, and is formed by droplet ejection.

Therefore, according to the device of the present invention, although at the substrate edge that dries quickly, the drying of the second conductive film that serves as dummy wiring progresses, at the wiring pattern region actually used as wiring, the solvent vapor density (atmosphere) becomes even due to the presence of the second conductive film, and it becomes possible to make the drying of the conductive film and the baking atmosphere even, and there by make the film thickness even. Thus, in the present invention, it is possible to eliminate unevenness in the conductivity and electrical properties caused by irregularities in the film thickness and the like.

In addition, it is possible to use as an ejected droplet one that includes a metal particle. A structure in which the second conductive film is used as a connecting terminal in addition to being simply used as dummy wiring is also advantageous.

Furthermore, it is also possible to select as a droplet one that includes a material that exhibits conductivity when exposed to heat or irradiation.

It is possible to use a structure in which the second conductive film is formed in the groove between the second banks formed outside the pattern formation region.

At least one of the banks and the second banks preferably has a liquid repellent which is higher than that of the groove therebetween.

Thereby, in the present invention, even if a portion of the ejected droplets lands on a bank, it falls off the bank because the bank surface is liquid repellant, and it flows down into the groove between the banks.

The second conductive film is preferably formed by the same material as the conductive film.

Thereby, in the present invention, because the liquid can be ejected continuously without being changed, the operations involved in replacing the liquid can be omitted and thus the production efficiency can be improved.

In addition, preferably the second conductive film has an arrangement (arrangement specifications) that is substantially the same as the conductive film and is formed continuously. For example, the wiring specification for the arrangement pitch, the wiring width and the like is made identical to that of the conductive film. In addition, by arranging the second conductive film continuously along the conductive film, separate production of the dot pattern (bitmap) during droplet ejection becomes unnecessary, and thereby it is possible to improve the operability.

In the case that conductive films are arranged at a plurality of differing pitches, a structure in which the second conductive film is arranged at a pitch that is the average of the plurality of pitches is also preferable.

In this case, it is possible to prevent the solvent vapor density differences between the conductive films from becoming uneven.

In addition, a structure is also advantageous in which the second conductive film is formed having a length that projects beyond both edges of the conductive film in the longitudinal direction of the conductive film.

In this case, it is possible to ameliorate the unevenness in the drying of the conductive film in the longitudinal length of the conductive film as well in order to make the film thickness uniform.

In addition, the second aspect of the present invention is an electro-optical apparatus having the device described above.

Thereby, in the present invention, because the wiring pattern is formed having a uniform film thickness, it is possible to obtain a high quality electro-optical apparatus in which unevenness of the electrical properties caused by irregularities in the film thickness of the wiring is eliminated.

In addition, the third aspect of the present invention is an electronic apparatus having the electro-optical apparatus described above.

Thereby, in the present invention, because the wiring pattern is formed having an uniform film thickness, it is possible to obtain a high quality electronic apparatus in which unevenness of the electrical properties caused by irregularities in the film thickness of the wiring is eliminated.

The fourth aspect of the present invention is a method of manufacture of a device, having the steps of forming banks on a substrate in a predetermined pattern formation region, forming a conductive film by ejecting droplets in the groove between the banks, and forming a second conductive film that is electrically separated from the conductive film by ejecting droplets outside the pattern formation region.

Thereby, in the present invention, although at the substrate edge that dries quickly the drying of the second conductive film serving as dummy wiring progresses, at the wiring pattern region actually used as wiring the solvent vapor density (atmosphere) is even due to the presence of the second conductive film, and it becomes possible to make the film thickness uniform by making the drying of the conductive film and the baking atmosphere even. Thus, in the present invention, it is possible to eliminate unevenness of the conductivity and electrical properties caused by irregularities in the film thickness and the like.

In addition, a fifth aspect of the present invention is a manufacturing method for an active matrix substrate, having a first step of forming gate wiring on a substrate, a second step of forming a gate insulating film on the gate wiring, a third step of laminating a semiconductor layer via the gate insulating film, a fourth step of forming source electrodes and drain electrodes on the gate insulating layer, a fifth step of disposing an insulating material on the source electrodes and the drain electrodes, and a sixth step of forming pixel electrodes after disposing the insulating material, wherein the device manufacturing method according to claim 1 is used in at least the first step, the fourth step, or the sixth step.

According to the present invention, it becomes possible to obtain an thin active matrix in which unevenness in the conductivity and electrical properties due to irregularities in the film thickness is eliminated in the gate wiring, the source electrode, drain electrode, and pixel electrode, and a thin film wiring pattern is formed.

BRIEF DESCRIPTION OF THE DRAWINGS

FIG. 5 is an enlarged schematic view showing a part of the wiring.

DETAILED DESCRIPTION OF THE INVENTION

Figure 1:
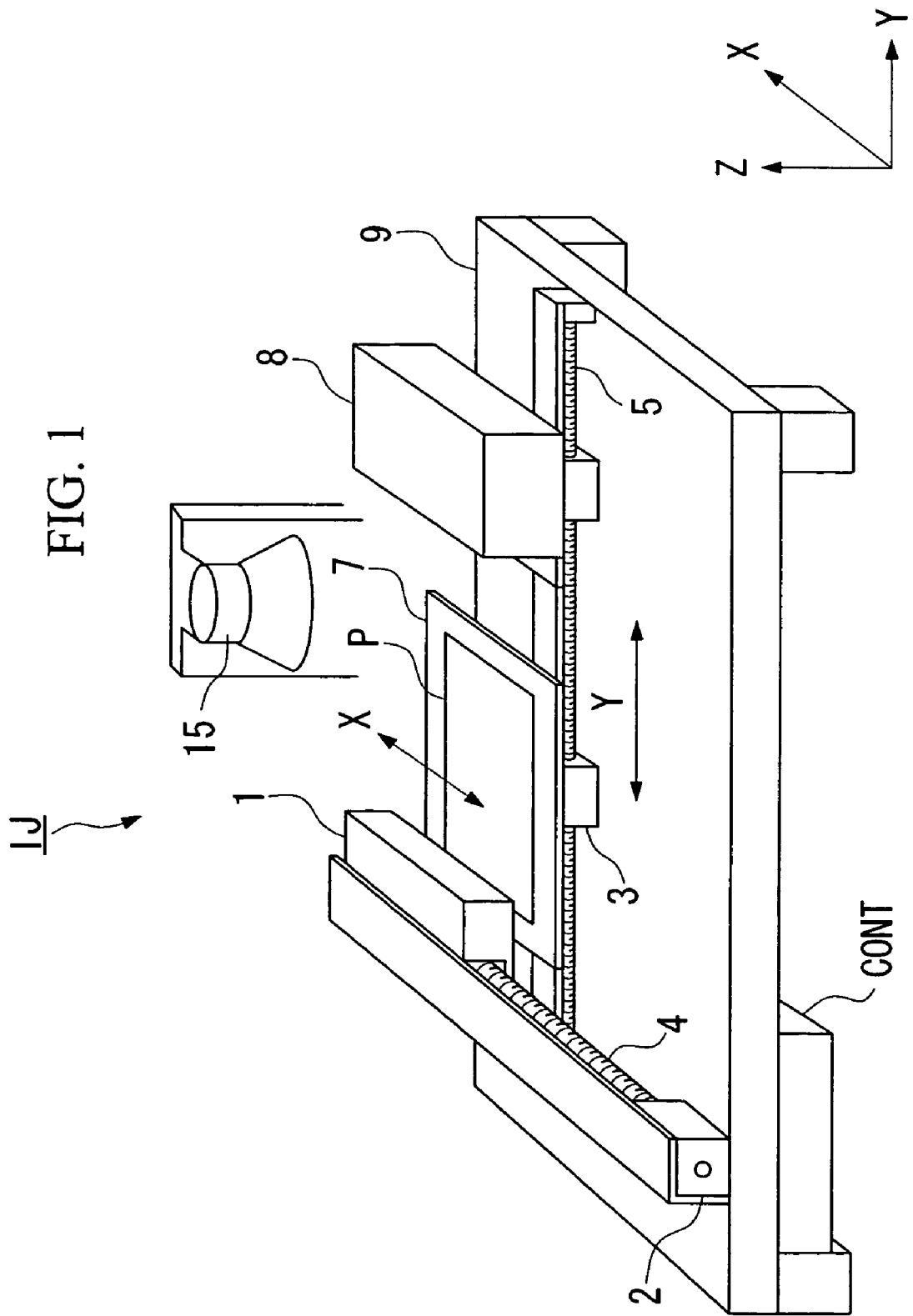
FIG. 1 is a schematic perspective view of a droplet ejection apparatus.

Below, the embodiments of the device and the method of manufacture thereof, the manufacturing method for the active matrix substrate, the electro-optical apparatus, and the electronic apparatus of the present invention are explained with reference to FIG. 1 to FIG. 20.

First Embodiment

The present embodiment will be explained by using an example of the case in which an ink (functional liquid) for wiring pattern (thin film pattern) that includes conductive particles is ejected as a droplet from the nozzle of a droplet ejection head by using a droplet ejection method, and thereby a wiring pattern formed is formed by a conducting film on a substrate.

The wiring pattern ink consists of a dispersing liquid that disperses conducting particles into a dispersing medium, and a solvent that disperses organic silver compounds and silver oxide nanoparticles in a medium (dispersion medium).

In the present embodiment, in addition to using metal particles including any one among, for example, gold, silver, copper, palladium, and nickel as the conducting particles, the oxides thereof, along with conducting polymers and superconducting particles can be used.

These conducting polymers can be used by coating an organic substance on the surface in order to improve the dispersibility. The diameter of the conducting particles is preferably equal to or greater than 1 nm and equal to or less than 0.1 μm. When the diameter is larger than 0.1 μm, there is a concern that they will plug the nozzle of the liquid ejection head described below. In addition, when the diameter is smaller than 1 nm, the volume ratio of the coating material to the conducting particle becomes large, and the proportion of the organic material in the obtained film becomes excessive.

The dispersing liquid is not particularly limited as long as the conducting particles described above can be dispersed and they do not flocculate. For example, besides water, it is possible to use alcohols such as methanol, ethanol, propanol, butanol, or the like; hydrocarbon compounds such as n-heptane, n-octane, decane, dodecane, tetradecane, toluene, xylene, cymene, durene, indene, dipentene, tetrahydronaphthalene, decahydronaphthalene, and cyclohexylbenzene; ether compounds such as ethylene glycol dimethylether, ethylene glycol diethylether, ethylene glycol methylethylether, diethylene glycol dimethylether, diethylene glycol diethylether, diethylene glycol methylethylether, 1,2-demetoxyethane, bis (2-methoxyethyl) ether, and p-dioxane; and further, polar compounds such as propylene carbonate, γ-butyrolactone, N-methyl-2-pyrolidone, dimethylformamide, dimethylsulfoxide, and cyclohexanone. Among these, in terms of the dispersibility of the particles, stability of the dispersing liquid, and ease of application to the droplet ejection method (inkjet method), water, alcohols, hydrocarbon compounds, and ether compounds are preferable, and as a preferable dispersion medium, water and hydrocarbon compounds can be cited.

The surface tension of the dispersing liquid for the conducting particles described above is preferably within a range equal to or greater than 0.02 N/m and equal to or less than 0.07 N/m. When ejecting the liquid in an inkjet method, if the surface tension is less than 0.02 N/n, the curvature of the ejection path occurs easily because leakage of the ink compound from the nozzle surface increases. If the surface tension exceeds 0.07 N/m, the control of the amount of the ejection and the ejection timing becomes difficult because the contour of the meniscus at the distal end of the nozzle is unstable. In order to adjust the surface tension, in the dispersing liquid, a fluoride, silicone, or nonionic surface tension modifier can be added in small amounts within a range in which the contact angle with the substrate does not decrease greatly. A nonionic surface tension modifier increases the leakage of the liquid to the substrate, improves the leveling of the film, and contributes to preventing occurrences of fine irregularities in the film. As necessary, the surface tension modifiers described above can also include organic compounds such as alcohol, ether, ester, ketone and the like. The viscosity of the dispersing liquid is preferably equal to or greater than 1 mpa·s and equal to or less than 50 mPa·s. During the ejection of the liquid material as a droplet by using an inkjet method, when the viscosity is smaller than 1 mPa·s, the vicinity of the nozzle easily becomes contaminated due to flowing out of the ink, and when the viscosity is larger than 50 mPa·s, the frequency of clogging of the nozzle holes becomes high and smooth ejection of the droplets becomes difficult.

Any type of glass, silicon glass, Si wafers, plastic films, metal plates, or the like can be used as the substrate on which the wiring pattern is formed. In addition, semiconductor films, metal films, dielectric films, organic films or the like can be formed as under layers on the surface of any type of these material substrates.

Here, the electrification control method, the pressure oscillation method, the electro-mechanical conversion method, the electro-thermal conversion method, and the electrostatic attraction method can be used as ejection technology for the droplet ejection method. The electrification control method imparts an electric charge to the material by using an electrification electrode, and controls the trajectory of the material by using a deflecting electrode to eject the material from the nozzle. In addition, a pressure oscillation method ejects the material to the distal end of the nozzle by applying an ultrahigh pressure of about 30 kg/cm$^2$ to the material. When a control voltage is not applied, the material is propelled forward to be ejected from the nozzle, and when the control voltage is applied, the electrostatic reaction within the material occurs, and thereby the material is scattered and is not ejected from the nozzle. In addition, the electro-mechanical conversion method exploits the characteristic that a piezo element deforms upon receiving a pulsed electrical signal. A pressure is applied to the space accommodating the material via a flexible substance due to the deformation of the piezo element, and the material is pushed out of this space and ejected from the nozzle.

In addition, the electro-thermal conversion method generates bubbles by rapidly vaporizing the material by a heater provided in the space that accommodates the material, and ejects the material in the space by the pressure of the bubbles. The electrostatic attraction method applies a fine pressure inside the space that accommodates the material, forms the meniscus of the material in the nozzle, and while in this state adds electrostatic attraction to draw out the material. In addition, besides these, technologies such as a method that uses the change in the viscosity of a fluid due to the application of an electrical field or a method in which the material is ejected by a discharge spark can be used. The droplet ejection method has the advantages that there is little wastage of the material and a desired amount of the material can be reliably disposed at a predetermined position. Note that the amount of one droplet of the liquid material (fluid) ejected in the droplet ejection method is, for example, 1 to 300 nanograms.

Next, a device fabrication apparatus used when fabricating the device according to the present invention will be explained.

A droplet ejection apparatus (inkjet device) that fabricates a device by ejecting droplets from a droplet ejection head to a substrate can be used as the device fabrication apparatus.

FIG. 1 is a perspective drawing showing the schematic configuration of the droplet ejection apparatus IJ.

The droplet ejection apparatus IJ provides a droplet ejection head 1, an X-axis direction drive axle 4, a Y-axis direction guide axle 5, a control device CONT, a stage 7, a cleaning mechanism 8, a platform 9, and a heater 15.

The stage 7 supports the substrate P to which the ink (fluid material) is applied by this droplet ejection apparatus IJ, and provides a fastening mechanism (not illustrated) that fastens the substrate P at a standard position.

The droplet ejection apparatus 1 is a multi-nozzle type droplet ejection head that provides a plurality of ejection nozzles, and the longitudinal direction and the Y-axis direction are made to coincide. The plurality of ejection nozzles are provided at a regular interval arranged in the Y-axis direction on the lower surface of the droplet ejection head 1.

Ink that includes the conducting particles described above is ejected from the ejection nozzle head 1 towards the substrate P supported by the stage 7.

An X-axis direction drive motor 2 is connected at the X-axis direction drive axle 4. The X-axis direction drive motor 2 is a stepping motor or the like, and when an X-axis direction drive signal is supplied from the control device CONT, the X-axis direction drive axle 4 rotates. When the X-axis direction drive axle 4 rotates, the droplet ejection head 1 is moved in the X-axis direction.

The Y-axis direction guide axle 5 is fastened so as not to move with respect to the platform 9. The stage 7 provides a Y-axis direction drive motor 3. The Y-axis direction drive motor 3 is a stepping motor or the like, and when a Y-axis direction drive signal is supplied the from the control device CONT, the stage 7 is moved in the Y-axis direction.

The control device CONT supplies a voltage for the ejection control of the droplet to the droplet ejection head 1. In addition, a drive pulse signal that controls the movement of the droplet ejection head 1 in the X-axis direction is supplied to the X-axis direction drive motor 2, and a drive pulse signal that controls the movement of the stage 7 in the Y-axis direction is supplied to the Y-axis direction drive motor 3.

The cleaning mechanism 8 cleans the droplet ejection head 1. A Y-axis direction drive motor (not illustrated) is provided in the cleaning mechanism 8. A y-axis direction drive motor (not illustrated) is provided in the cleaning mechanism 8. Due to the drive of this Y-axis direction drive motor, the cleaning mechanism 8 moves along the Y-axis direction guide axle 5. The movement of the cleaning mechanism 8 is controlled by the control device CONT.

The heater 15 is a device that heat treats the substrate P by lamp annealing, and carries out vaporization and drying of the medium that contains the liquid material that is applied to the substrate P. The control device CONT also controls the supply and interruption of the power source to the heater 15.

The droplet ejection apparatus IJ ejects the droplet to the substrate P while scanning relative to the droplet ejection head 1 and the stage 7 that supports the substrate P. Here, in the following explanation, the X-axis direction is the scanning direction and the Y-axis direction perpendicular to the X-axis direction is the non-scanning direction. Therefore, the ejection nozzle of the droplet ejection heads 1 are provided arranged at regular intervals in the Y-axis direction, which is the non-scanning direction. Note that in FIG. 1, the droplet ejection head 1 is disposed at a right angle with respect to the forward direction of the substrate P, but the it is also possible to adjust the angle of the droplet ejection head 1 so that the droplet ejection heads 1 intersects the forward direction of the substrate P.

In this manner, by adjusting the angle of the droplet ejection head 1, it is possible to adjust the pitch between the nozzles. In addition, it is also possible to adjust arbitrarily the distance between the substrate P and the nozzle surface.

Figure 2:
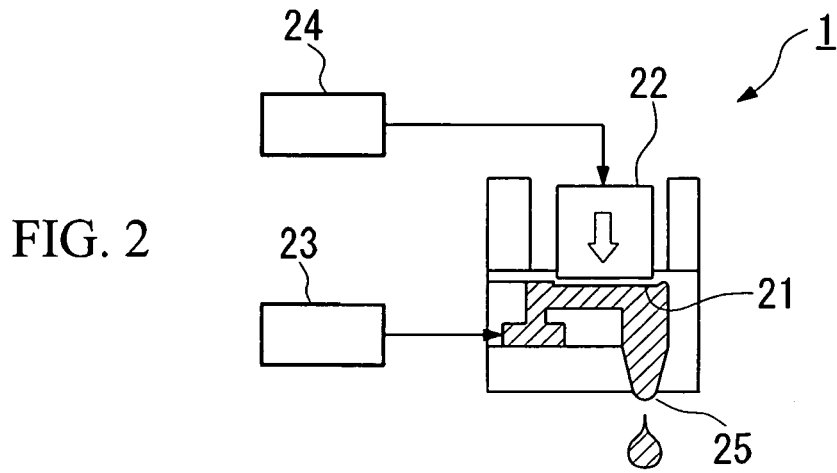
FIG. 2 is a drawing for explaining the piezo-based ejection principle for the liquid.

FIG. 2 is a drawing for explaining the ejection principle of the fluid material according to the piezo method.

In FIG. 2, a piezo element 22 is disposed adjacent to a fluid chamber 21 that accommodates a liquid material (wiring pattern ink, functional liquid). The fluid material is supplied to the fluid chamber 21 via a fluid material supply system 23 that, includes a material tank that accommodates the fluid material. The piezo element 22 is connected to a drive circuit 24, a voltage is applied to the piezo element 22 via the drive circuit 24 causing the piezo element 22 to be deformed. Thereby, the fluid chamber 21 is deformed and thereby the fluid material is ejected from the nozzle 25. In this case, the deformation amount of the piezo element 22 can be controlled by changing the value of the applied voltage using a predetermined drive waveform. In addition, the speed of the distortion of the piezo element 22 can be controlled by changing the frequency of the applied voltage. Thus, there is the advantage that it is difficult to influence the composition of the material because the droplet ejection by the piezo method does not apply heat to the material.

Next, a method in which conducting film wiring is formed on a substrate is explained as an example of the embodiment of the wiring pattern formation method (thin film pattern formation method) of the present invention with reference to FIG. 3 to FIG. 7.

Figure 3A:
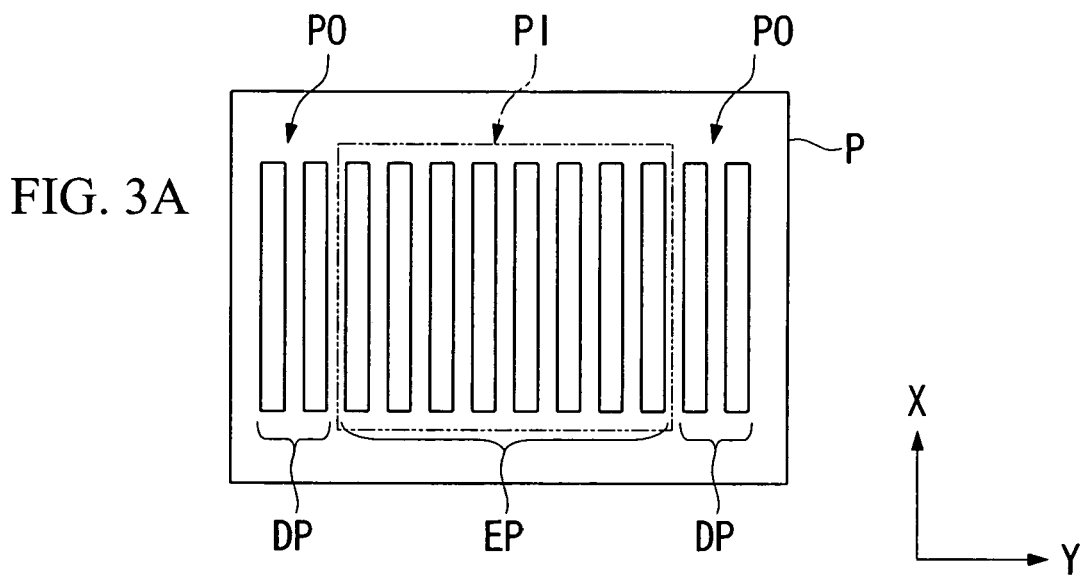
FIGS. 3A and 3B are planar views of the substrate on which the pattern is formed.

In the present embodiment, as shown in FIG. 3A, an electrode pattern (electrode film) EP is formed on the wiring pattern region (pattern formation region) PI positioned at the approximate center of the substrate P, and a dummy pattern (second conductive film) that is wired electrically separated from the electrode pattern EP is formed on the dummy region PO outside the wiring pattern region (the periphery).

The electrode pattern EP is wired at a 360 μm alignment pitch having a line width of 120 μm and a line space of 240 μm. The dummy patterns DP are formed by a material that is identical to that of the electrode pattern EP, and the line space between the dummy patterns DP and the electrode pattern EP that is adjacent to the boundary of the wiring pattern region PI and the dummy region PO is wired at 240 μm, so as to be wired at an alignment identical to that of the electrode pattern EP (an 360 μm alignment pitch having a line width of 120 μm and a line space of 240 μm) and arranged continuously.

The wiring pattern formation method according to the present embodiment disposes the wiring pattern ink described above on the substrate, and forms a conducting pattern for wiring (electrode pattern EP and dummy pattern DP) on this substrate, and generally consists of a bank formation step, a residue treatment step, a liquid repelling treatment step, a material disposition step and intermediate drying step, and a baking step.

Below, each of the steps will be explained in detail.

(Bank Formation Step)

A bank is a member that functions as a partition member, and the formation of a bank can be carried out by any arbitrary method, such as a lithographic method or a printing method. For example, in the case of using lithographic method, an organic photosensitive material is applied in alignment with the height of the bank on the substrate P by using a predetermined method such as spin coating, spray coating, roll coating, die coating, dip coating or the like, and a resist layer is applied thereto. In addition, in conformity with the bank profile (the electrode pattern EP and the dummy pattern DP), masking is carried out, the resist is exposed and developed, and thereby a resist remains that conforms to the bank profile. Last, etching is carried out, and bank material in parts that are outside the mask is removed.

In addition, the bank (convex part) can be formed using two layers, where the lower layer is material consisting of an organic or inorganic substance and is liquid-attracting with respect to the functional liquid, and the upper layer is formed by a material consisting of an organic substance and is water-repelling.

Figure 4A:
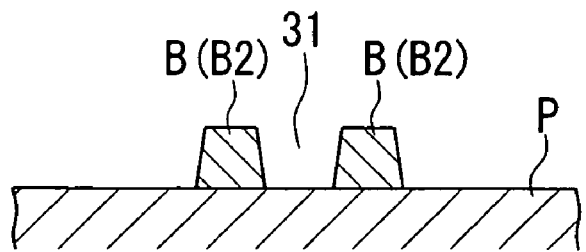
FIG. 4A to FIG. 4D are drawings showing the sequence of wiring pattern formation.

Thereby, as shown in FIG. 4A, banks B and B project, for example, 10 μm, so as to surround the groove 31, which is the region in which the electrode pattern EP is to be formed in the wiring pattern region PI. Note that in the dummy region PO as well; outside the grooves in which the dummy pattern DP is to be formed, the banks (second banks) B2 are formed, but because both are identical in cross-section shape, FIG. 4A to FIG. 4D illustrate both the electrode pattern EP and the dummy pattern DP.

Note that with respect to the substrate P, as a surface improvement treatment before the organic material application, HMDS treatment can be carried out (a method in which $(CH_3)_3SiNHSi(CH_3)_3$ is applied by vaporization), but in FIG. 4A to FIG. 4D, the illustration thereof is omitted.

A material that exhibits a liquid repellent with respect to the fluid material can be used as the organic material to form the banks, and as will be described below, an insulating organic material can be used that can impart a liquid repelling property by using a plasma treatment, has a good adhesiveness to the lower substrate, and allows easy patterning using photolithography. For example, it is possible to use a high molecular material such as an acryl resin, a polyimide resin, an olefin resin, a melanin resin or the like.

(Residue Treatment Step (Liquid Attraction Treatment Step))

Next, the substrate P undergoes residue treatment in order to remove the resist (organic material) between banks remaining residue from bank formation.

As a residue treatment, it is possible to select an ultraviolet (UV) irradiation treatment that carries out the residue treatment by irradiation with ultraviolet light, an $O_2$ plasma treatment in which oxygen in the atmosphere serves as the treatment gas, and the like. Here, $O_2$ plasma treatment is carried out.

Concretely, this is carried out by irradiating the substrate P with oxygen plasma from a plasma discharge electrode. The conditions for the $O_2$ plasma treatment are, for example, a plasma power between 50 to 1000 W, an oxygen gas flow rate of 50 to 100 mm/sec, a conveyance speed for the substrate P of 0.5 to 10 mm/sec with respect to the plasma discharge electrode, and a substrate temperature of 70 to 90° C.

Note that in the case that the substrate P is a glass substrate, the surface thereof is liquid-attracting with respect to the wire pattern formation material, but like the present embodiment, it is possible to increase the liquid-attracting property of the groove 31 by carrying out $O_2$ plasma treatment and ultraviolet light irradiation treatment for the residue treatment. In the present embodiment, plasma treatment conditions are adjusted (for example, by slowing the conveyance speed of the substrates P and by lengthening the plasma treatment time) such that the contact angle of the groove 31 with respect to the organic silver compound (described below) used as the wiring pattern formation material becomes equal to or less than 10°.

(Liquid Repelling Treatment Step)

Next, a liquid repelling treatment is carried out on the banks B and B2, and liquid repellent is imparted to the surface thereof. It is possible to use a plasma treatment method ($CF_4$ plasma treatment method) in the atmosphere, in which tetrafluoromethane is used as the treatment gas. The conditions for the $CF_4$ plasma treatment are, for example, a plasma power between 50 to 1000 W, an $CF_4$ flow rate of 50 to 100 ml/min, a substrate conveyance speed of 0.5 to 1020 mm/sec with respect to eh plasma discharge electrode, and a substrate temperature of 70 to 90° C.

Note that the treatment gas is not limited to $CF_4$, but other fluorocarbon type gases can be used. In the present embodiment, the plasma treatment conditions are adjusted (for example, by slowing the conveyance speed of the substrates P and by lengthening the plasma treatment time) such that the contact angle of the bank B with respect to the organic silver compound used as the wiring pattern formation material becomes equal to or less than 60°.

By carrying out this type of liquid repelling treatment, a fluorine group is introduced into the resin that forms the banks B and B, and a high liquid repellent is imparted to the groove 31. Note that the above-described $O_2$ plasma treatment used as a liquid attraction treatment can be carried out before formation of the banks B. However, because acrylic resins, polyimide resins and the like have the property that fluoridating (liquid repelling) is easier when pretreatment using an $O_2$ plasma is carried out, preferably the $O_2$ plasma treatment is carried out after the banks B and B2 have been formed.

Note that although there is a small influence on the substrate P surface that has undergone the liquid attraction treatment first due to the liquid attraction treatment of the banks B and B2, and in particular, in the case that the substrate P consists of glass or the like, the introduction of the fluoride group does not occur due to the liquid repelling treatment, and thus, the liquid attraction, that is, the leakage, of the substrate P is substantially unimpaired.

In addition, the liquid repelling treatment can be omitted by forming the banks B and B with a material (for example, a resin material having a fluorine group) that is liquid repellent.

A substrate for thin film patterning is formed by the bank formation step, the residue treatment step, and the liquid repelling treatment step.

(Material Disposition Step and Intermediate Drying Step)

Next, using a droplet ejection method employing the droplet ejection apparatus IJ, the wiring pattern formation material is applied to the groove 31 on the substrate P. Note that here an ink (dispersing liquid) is ejected in which silver is used as the conducting particle, and diethylene glycol ethylether is used as the solvent (dispersion medium).

Specifically, in the material disposition step, after the preparatory ejection has been carried out in the flashing region (not illustrated), the drops are ejected into the groove between the banks, and thereby the dummy pattern DP in the dummy region PO (for example, in FIG. 3A, the dummy region on the left side), the electrode pattern EP in the wiring pattern region PI, and the dummy pattern DP in the dummy region PO (for example, in FIG. 3A, the dummy region on the right side) are formed in sequence.

Figure 4B:
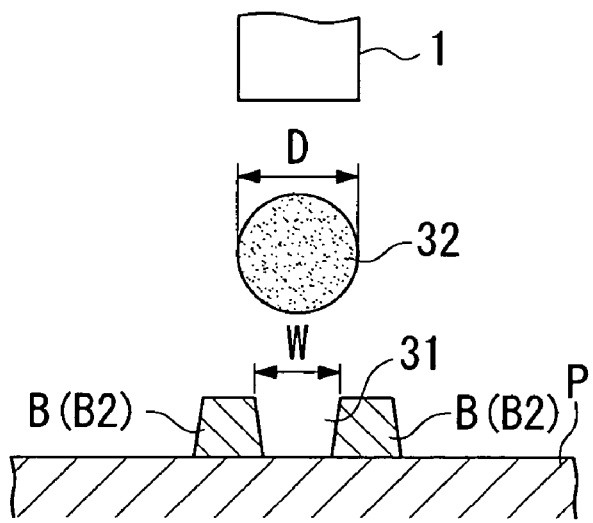
Figure 4C:
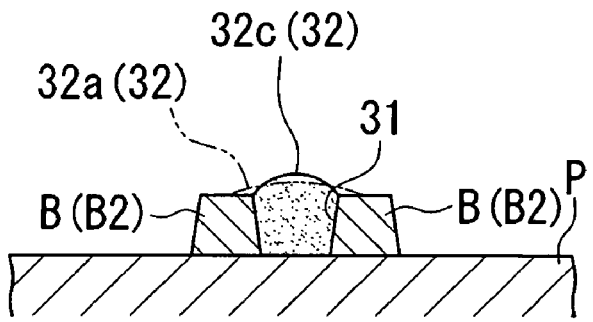

In more detail, as shown in FIG. 4B, while the liquid ejection head 1 of the droplet ejection apparatus IJ described above and the substrate P are moved relative to each other, the liquid material that includes the wiring pattern formation material is ejected from the liquid ejection head 1 as droplets 32, and the droplets 32 are disposed in the groove 31 on the substrate P. Concretely, along the longitudinal direction of the groove 31 (the formation direction of the wiring pattern), while the droplet ejection head 1 and the substrate P move relative to one another, the droplets 32 are ejected in plurality at a predetermined pitch, and thereby a line-shaped wiring pattern is formed as described below.

Note that in this example, the diameter D of the droplet 32 is larger than the width W (in this example, the width at the opening part of the groove 31) of the groove 31 formed by banks B and B2.

Here, as shown in FIG. 5, the control device CONT of the droplet ejection apparatus IJ sets a bitmap consisting of a plurality of bits in a lattice form (unit lattice) on the substrate P, and based on the bitmap that has been set on the substrate P, while scanning in the X-axis direction with respect to the substrate P, among the plurality of bits in the bitmap, carries out the ejection action for droplets for predetermined bits (the bits that form the electrode pattern 31 and the dummy pattern 32), and thereby the electrode pattern EP and the dummy pattern DP are formed continuously on the substrate P in the same process.

At this time, the droplet 32 is ejected from the droplet ejection head 1, and when the liquid is disposed in the groove 31, because the surface of the banks B and B2 is liquid repellent and has a tapered shape, the portion of the droplets 32 that land on these banks B and B2 fall off the banks B and B2, and then flows down into the groove 31 due to the capillary action of the groove 31.

Figure 6A:
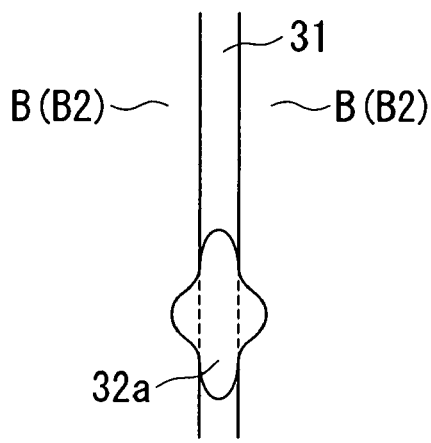
FIG. 6A to FIG. 6C are drawings for explaining the behavior of the ejected liquid.

However, the diameter D of the droplets 32 is larger than the width W of the groove 31, and thus, as shown in FIG. 6A (shown by the two-point chain line in FIG. 4C), a portion of the ejected liquid (shown by reference numeral 32a) overflows and remains on the banks B and B2.

Next the droplets 32 are ejected to the position of the groove 31 separated by a pitch L, and this ejection pitch L is set to a size that, when the liquid (droplets) ejected into the groove 31 overflows and spreads, droplets 32 are ejected separated by a pitch L and merge with the adjacent liquid. This is experimentally found beforehand.

Figure 6B:
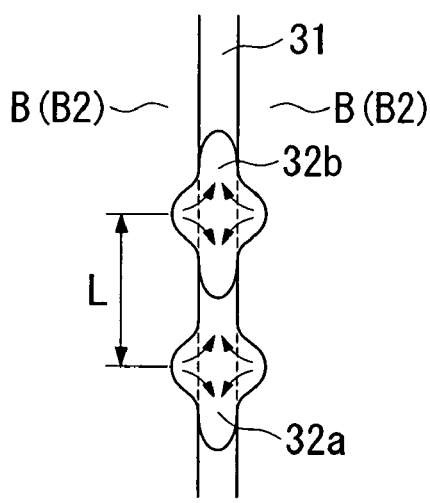

Specifically, as shown in FIG. 6B, the liquid (denoted by reference numeral 32b) that is ejected separated by a distance L from the liquid 32a overflows and spreads, and thereby merges with the liquid 32a that has been ejected previously. At this time, a portion of the liquid 32b as well overflows and can remain on the banks B and B2, but when the liquids 32a and 32b join, due to the contacting portions pulling against each other, the liquid remaining on the banks B and B2 is drawn into the groove 31, as shown by the arrow in the figure.

Figure 6C:
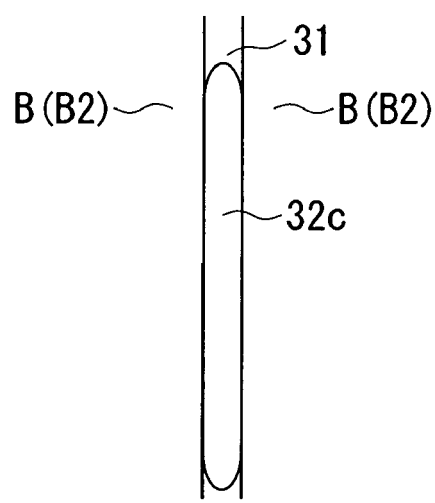

As a result, as shown by reference numeral 32c in FIG. 4 and FIG. 6, the liquid forms a line-shape that is trapped in the groove 31 without overflowing the banks B and B2.

In addition, the liquids 32a and 32b that have been ejected into the groove 31 or flowed down from the banks B and B2 easily spread more widely because the substrate P has undergone liquid attracting treatment, and thereby the liquid 32a and 32b fill the groove 31 more evenly. Therefore, although the width W of the groove 31 is narrower (smaller) than the diameter D of a droplet 32, the droplets 32 (liquid 32a and 32b) ejected towards the inside of the groove 31 does not remain on the banks B and B2, are advantageously trapped in the groove 31, and fill the groove 31 evenly.

(Intermediate Drying Process)

After ejecting the droplet onto the substrate P, a drying treatment is carried out as necessary in order to remove the dispersion medium. The drying treatment can be carried out by a heating treatment that uses, for example, a normal hotplate or electric furnace that heats the substrate P. In the present embodiment, for example, heating is carried out at 180° C. for about 60 minutes. This heating can be carried out in an $N_2$ atmosphere or the like, and it is not always necessary to carry this step out in the atmosphere.

In addition, this drying treatment can be carried out by lamp annealing.

While not particularly limited, the light source for the light used in the lamp annealing can be an infrared lamp, a xenon lamp, a YAG laser, argon laser, a carbon gas laser, or an excimer laser such as XeF, XeCl, XeBr, KrF, KrCl, ArF, or ArCl. These light sources are generally used within an output range equal to or greater than 10 W and equal to or less than 5000 W, but in the present embodiment, a range equal to or greater than 100 W and equal to or less than 5000 W is sufficient.

By repeatedly carrying out the intermediate drying step and the material disposition step described above, a wiring pattern can be formed that has the desired film thickness.

(Baking Step)

The dry film after the ejection step is to improve the electrical contact between particles, and the dispersing medium must be completely removed. In addition, in the case that the surface of the conducting particles is coated with coating material such as an organic substance in order to improve the dispersibility, it is necessary to remove the coating material. Thus, heat treatment and/or light treatment is carried out on the substrate after the ejection step.

The heat treatment and/or light treatment are normally carried out in the atmosphere, but depending on necessity, the treatments can also be carried out in an inert gas atmosphere such as nitrogen, argon, or helium. The treatment temperature during the heat treatment and/or light treatment is suitably set taking into account the boiling point (vapor pressure) of the diffusion medium, the type and pressure of the atmosphere gas, the dispersibility of the particles and the thermal behavior of oxidizing properties, the presence or absence of the coating material and the amount thereof if present, the heat resistance temperature of the substrate, and the like.

For example, in order to remove a coating material consisting of an organic substance, baking must be carried out at approximately 300° C. In addition, in the case that a substrate such as plastic is used, preferably the temperature is greater than or equal to room temperature and equal to or less than 100° C.

Figure 4D:
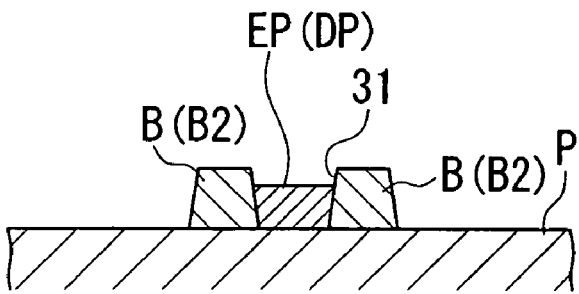

Due to the above steps, the electrical contact between the particles in the dry film after the ejection step is guaranteed, and the film is converted into a conducting film. Thereby, as shown in FIG. 4D, a conducting pattern that is a linear and continuous film, that is, the electrode pattern EP (and the dummy pattern DP) is obtained.

Figure 7:
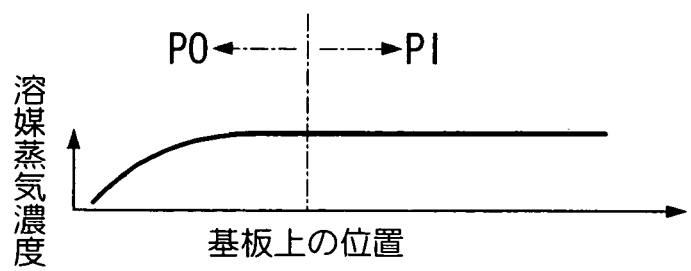
FIG. 7 is a drawing showing the relationship between the position of the pattern and the solvent vapor pressure and density.

Here, the relationship between the position of the pattern on the substrate and the solvent vapor density during heat treatment is shown in FIG. 7.

As shown in the figure, at the edge of the substrate where the dummy pattern DP has been wired, the vapor density of the solvent that has vaporized from the pattern (functional liquid) is low and the drying proceeds quickly, while in contrast on the inner side of the substrate where the electrode pattern EP has been wired, due to the presence of the dummy pattern DP, the solvent vapor density is a high value in comparison to the outer side, and becomes constant. Specifically, the region where there is a concern that the baking condition will become defective (removing the dispersion medium, evenly removing the coating material) becomes the dummy region PO on the outer side of the wiring pattern region PI, and the baking condition of the electrode pattern EP used in the display is advantageous.

Due to the sequence of steps described above, a linear conducting pattern (conducting film wiring) is formed on the substrate.

In this manner, in the present embodiment, the dummy pattern DP is wired outside the wiring pattern region PR by droplet ejection, and thus even if a distribution in the solvent vapor density occurs during the drying and baking, favorable baking condition can be easily obtained for the electrode pattern EP, and it becomes possible to suppress the occurrence of irregularities in the film thickness. Thereby, it is possible to prevent the mismatch between the wiring width and the film thickness between overlapping conducting film patterns caused by unevenness in the drying conditions, and it is possible to form overlapping patterns such that deviations in the film thickness do not occur. Therefore, it is possible to prevent the occurrence of unevenness in the conductivity and electrical properties due to irregularities in the film thickness, and thereby it becomes possible to fabricate a high quality device.

In addition, in the present embodiment, because the electrode pattern EP and the dummy pattern DP are formed using the same material, it is possible to form the patterns of both the electrode pattern EP and the dummy pattern DP using the same ejection processing step (material deposition step), it becomes possible to eliminate the time required to replace the liquids, and thus it becomes possible to increase the production efficiency. Furthermore, in the present embodiment, because the electrode pattern EP and the dummy pattern DP are disposed using the same alignment (specifications) and the droplet ejection process is carried out continuously, separately producing bitmaps (bit patterns) during the droplet ejection becomes unnecessary, and thereby it is also possible to shorten the time required for bitmap production.

Furthermore, in the present embodiment, because the banks B and B2 have imparted a liquid repelling property that is higher than that of the groove 31, even of a portion of the ejected droplet lands on the banks B and B2, the droplet falls off due to the liquid repellant property, flows down into the groove 31, the liquid can be applied more evenly, and thereby it becomes possible to obtain an electrode pattern EP having a uniform film thickness. In addition, in the present embodiment, even in the case that the width of the groove 31 is smaller than the diameter of the droplet 32, the droplet fills the groove 31, and thus it becomes possible to obtain a small-scale device having a more narrowly formed wiring pattern. At the same time, it becomes possible to obtain a high quality device without the occurrence of defects such as short circuits.

Furthermore, because resistance checks and quality tests such as conducting tests and adhesion tests on the electrode pattern EP are carried out by using the dummy pattern DP, it is possible to prevent damage to the electrode pattern EP, and in addition, because the dummy pattern DP is disposed at the edge, the effect is obtained that during tests the dummy pattern DP is easier to access in comparison to the electrode pattern EP.

Second Embodiment

A liquid crystal display apparatus, which is one example of the electro-optical apparatus of the present invention, will be explained as a second embodiment.

Figure 8:
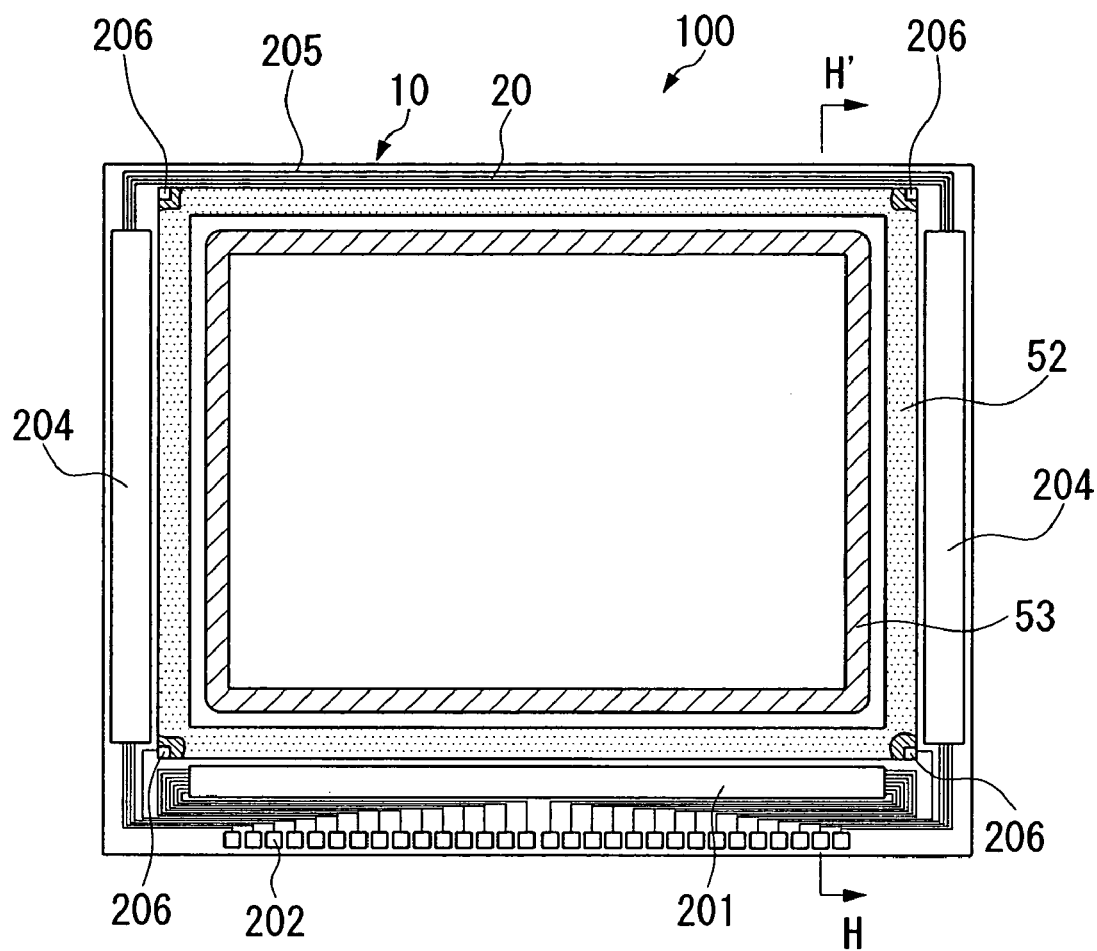
FIG. 8 is a planar view seen from the side of the substrate opposite to the liquid crystal display apparatus.
Figure 9:
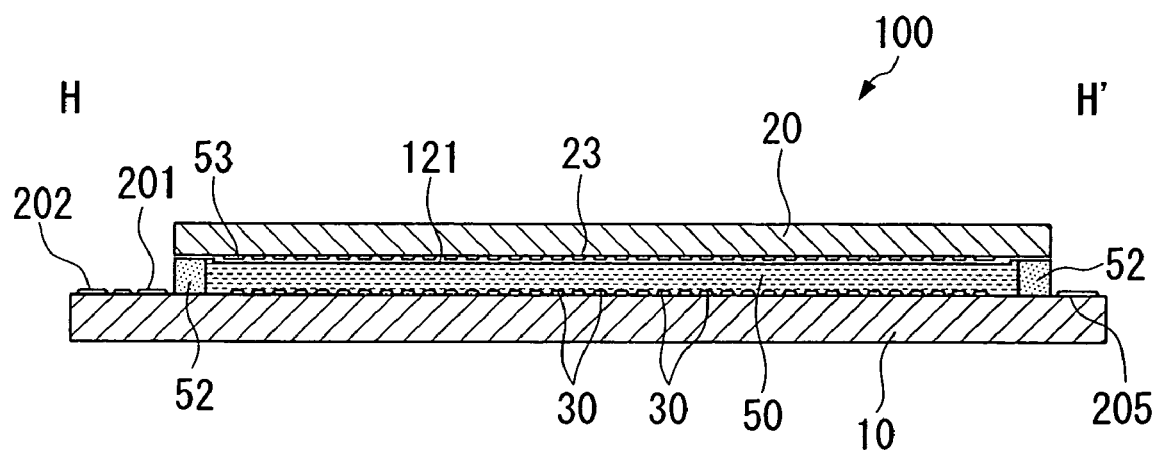
FIG. 9 is a cross-sectional view along line H-H' in FIG. 8.
Figure 10:
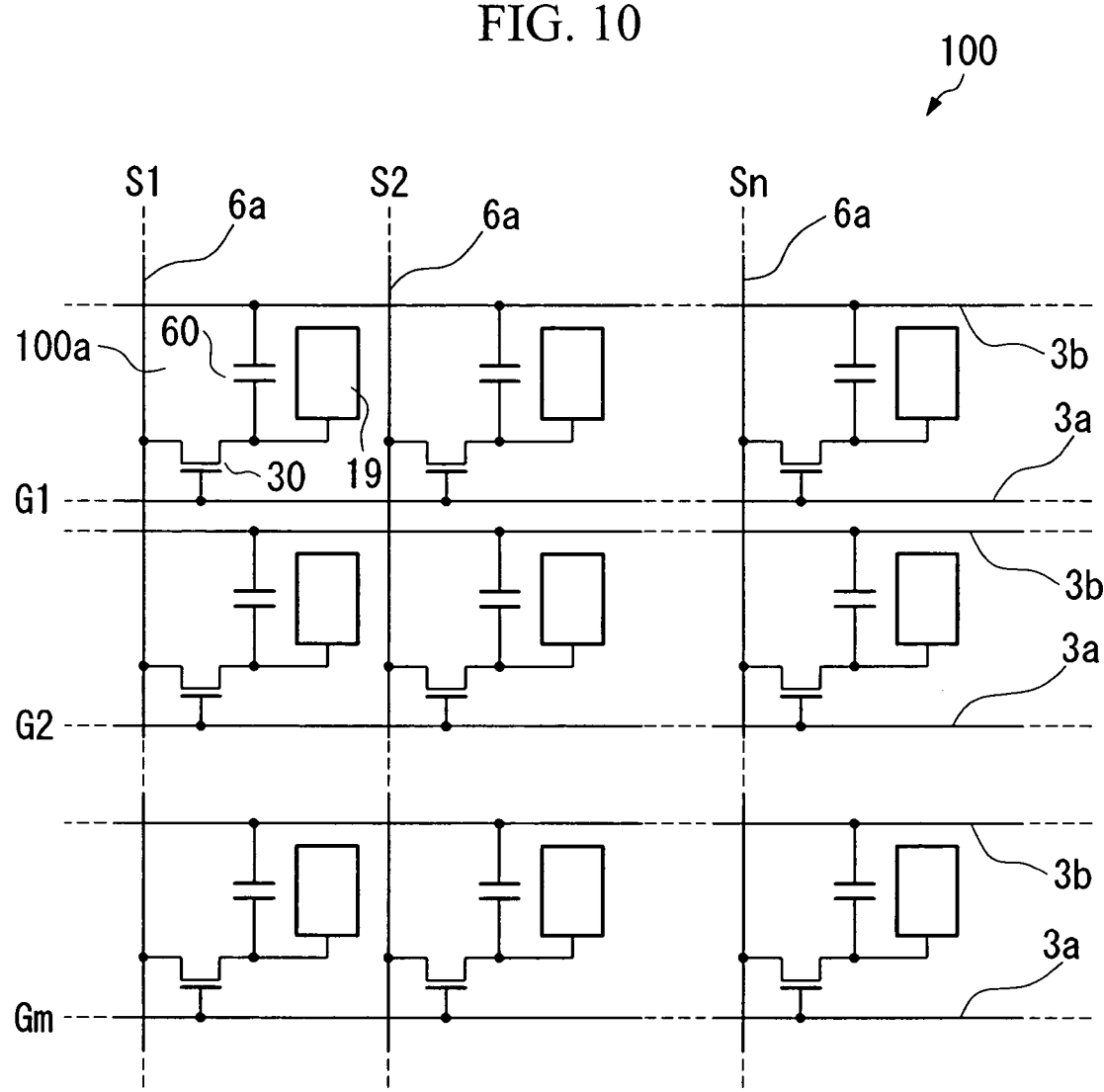
FIG. 10 is an equalizing circuit diagram for the liquid crystal display apparatus.

FIG. 8 is a planar drawing viewed from the side of the substrate opposite to the liquid crystal display apparatus, along with each of the structural elements. FIG. 9 is a cross-sectional view along the line H-H' in FIG. 8. FIG. 10 is an equalizing circuit diagram for each of the elements, wiring, and the like in the plurality of pixels formed in a matrix shape in the image display region of the liquid crystal display apparatus, and FIG. 11 is a partially enlarged cross-sectional drawing of the liquid crystal display device. Note that in each of the figures used in the following explanations, in order to make each of the layers and each of the members large enough to be visible in the drawings, each of the layers and each of the members are not drawn to scale.

In FIG. 8 and FIG. 9, in the liquid crystal display apparatus (electro-optical apparatus) 100 of the present embodiment, a TFT array substrate 10 and an opposing substrate 20, which form a pair, are attached by a sealing material 52, which is a photo-curing sealing material, and the liquid crystals 50 are enclosed and protected in the region partitioned by this sealing material 52. The sealing material 52 is formed in the shape of a closed frame on a region in the substrate surface, does not provide a liquid crystal injection opening, and there is no sealed seam in the sealing material.

A circumferential parting line 53 consisting of a light blocking material is formed in the area inside the formation area of the sealing material 52. In the area outside the sealing material 52, the data line drive circuit 201 and the package terminals 202 are formed along one edge of the TFT array substrate 10, and scanning line drive circuits 204 are formed along two edges that is adjacent to this one edge. On the remaining edge of the TFT array substrate 10, a plurality of wirings 205 are provided to connect the scanning line drive circuits 204 provided on both sides of the image display area. In addition, in at least one location on the corner portion of the opposing substrate 20, an inter-substrate conducting member 206 is disposed in order to provide electrical conduction between the TFT array substrate 10 and the opposing substrate 20.

Note that instead of forming the data line drive circuit 201 and the scanning line drive circuits 204 on the TFT array substrate 10, it is possible, for example, to electrically and mechanically connect a TAB (tape automated bonding) substrate packaging the drive LSI and the peripheral portion of TFT array substrate 10 via an anisotropic conducting film. Note also that in the liquid crystal display apparatus 100, depending on the type of the liquid crystal 50 to be used, a phase difference plate or a polarized light plate are disposed at a predetermined angle, but here the illustration thereof has been omitted. Examples of such operating modes are the TN (twisted nematic) mode, C-TN method, VA format, IPS format and the like, and the normally white mode/normally black mode.

In addition, in the case that the liquid crystal display device 100 is formed for color display, in the opposing substrate 20, red (R), green (G), and blue (B) color filters are formed along with the protecting films therefore in the area opposed to each of the pixel electrodes (described below) of the TFT array substrate 10.

In the image display area of the liquid crystal display apparatus 100 having the this type of structure, as shown in FIG. 10, a plurality of pixels 100a are formed as a matrix, and in addition, in each of these pixels 100a, a pixel switching TFT (switching element) 30 is formed, and data lines 6a that supply pixel signals S1, S1, . . . , Sn are electrically connected to the source of the TFT 30. The pixel signals S1, S2, . . . , Sn that write to the data lines 6a can be supplied in this order to the lines in sequence, or, for the plurality of adjacent data lines 6a, can be supplied to each group. In addition, at the gates of the TFT 30, the scanning lines 3a are electrically connected, and at a predetermined timing, the scanning signals G1, G2, . . . , Gm are applied as pulses to the scanning lines 3a in this order to the lines in sequence.

The pixel electrode 19 is electrically connected to the drain of the TFT 30, and by turning ON the TFT 30 that is a switching element for a constant interval, the pixel signals S1, S2, . . . , Sn supplied from the data lines 6a are written at a predetermined timing into each of the pixels. In this manner, pixel signals S1, S2, . . . , Sn written to the liquid crystals via the pixel electrode 19 at a predetermined level are maintained at a constant interval between the opposing electrodes 121 of the opposing substrate 20 shown in FIG. 9. Note that in order to prevent leakage of the maintained pixel signals S1, S2, . . . , Sn, an accumulating capacitance 60 is added parallel to the liquid crystal capacitance formed between the pixel electrode 19 and the opposing electrodes 121. For example, the voltage of the pixel electrode 19 can be held by the accumulating capacitance 60 by a time period that is three digits longer that the interval that the source voltage is applied. Thereby, the charge holding characteristics are improved, and thereby it is possible to realize a liquid crystal display device 100 that has a high contrast ratio.

Figure 11A:
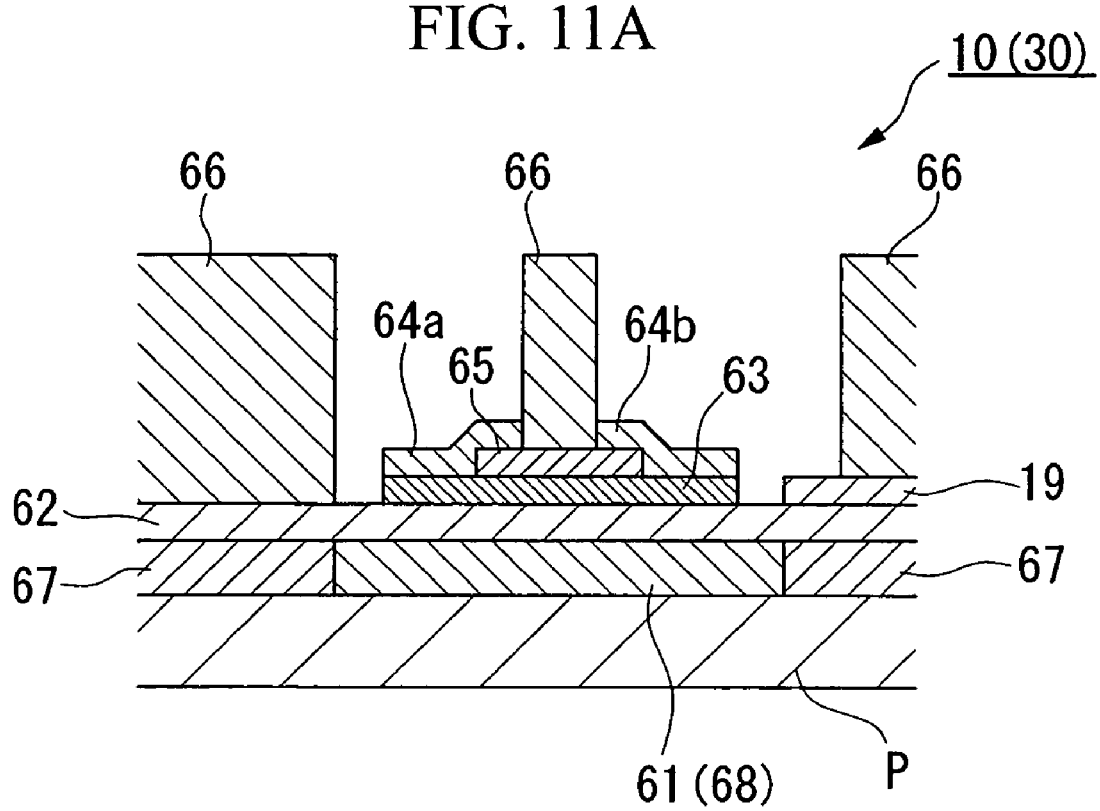
FIG. 11A and FIG. 11B are partial enlarged cross-sectional views of the liquid crystal display apparatus.

FIG. 11A is a partial expanded cross-sectional drawing of the liquid crystal display apparatus 100 having the bottom gate TFT 30, and on the glass substrate P that forms the TFT array substrate 10, banks 67 and 67 project, and the gate wiring 61 is formed in the groove 68 between the banks 67 and 67 by the wiring pattern formation method of the first embodiment. Note that, in the present embodiment, when (forming the concave part for) forming the gate wiring 61, the gate wiring 61 is heated up to approximately 350° C. in a process that forms an amorphous silicon layer described below, and thus an inorganic bank material is used as a material that can withstand this temperature.

A semiconductor layer 63 consisting of an amorphous silicon (a-Si) layer is laminated via a gate insulating layer 62 consisting of SiNx on the gate wiring 61. A portion of the semiconductor layer 63 that opposes this gate wiring portion serves as the channel area. Junction layers 64a and 64b consisting of an N$^+$ a-Si layer, for example, are laminated on the semiconductor layer 63 in order to obtain an ohmic junction, and an insulating etch stop film 65 consisting of SiN$_x$ is formed on the semiconductor layer 63 in the center portion of the channel in order to protect the channel. Note that the gate insulating layer 62, the semiconductor layer 63, and the etch stop film 65 are patterned as shown in the figure by applying a resist coating after vaporization (CVD), light sensitizing/development, and photoetching.

Furthermore, patterning is carried out as shown in the figure by similarly forming the pixel electrode 19 consisting of the junction layers 64a and 64b, and the ITO (Indium Tin Oxide), and carrying out photoetching. In addition, it is possible to form a source line and a drain line by setting up banks 66 on the pixel electrode 19, the gate insulating layer 62, and the etch stop film 65, using the droplet ejection apparatus IJ described above between these banks 66, and ejecting droplets of a silver compound.

Figure 11B:
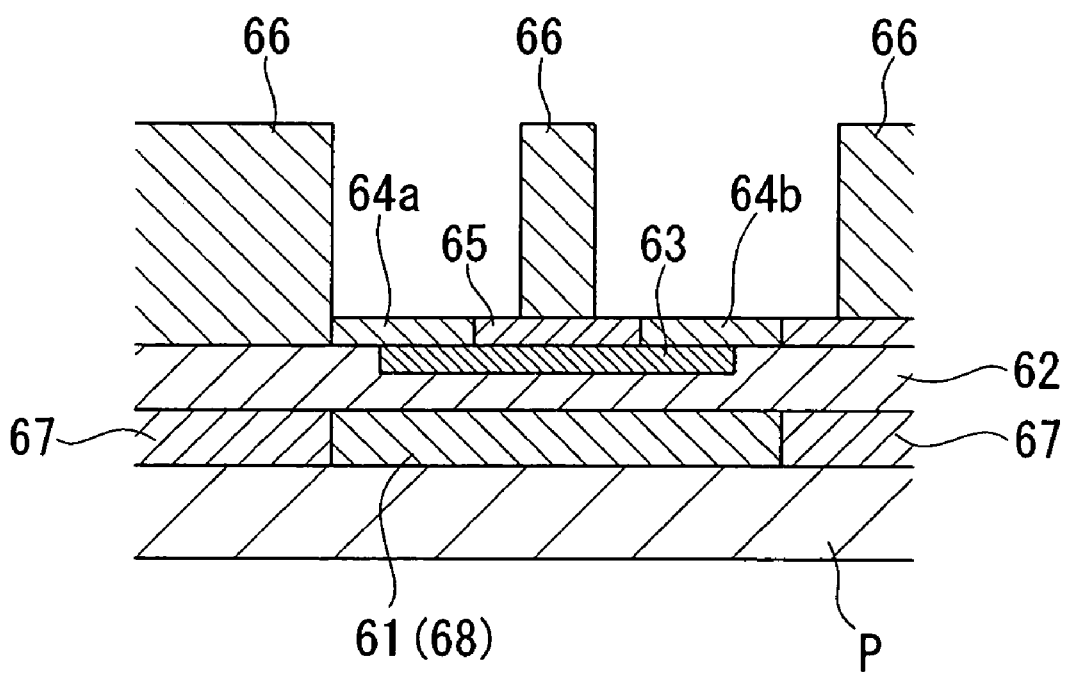

Note that as shown in FIG. 11B, a concave part is provided in the gate insulating layer 62, the semiconductor layer 63 is formed substantially flush to the surface of the gate insulating layer 62 thereon, and thereby it is possible to form the junction layers 64a and 64b, the pixel electrode 19, and the etch step film 65. In this case, by making the groove bottom parts between the banks 66 flat, each of these layers, the source line, and the drain line do not curve in cross-section, and thus it is possible to make a TFT having superior flatness and high performance characteristics.

In the TFT described above, by using the droplet ejection apparatus IJ described above, it is possible to form gate wiring, source wiring, drain wiring and the like by ejecting droplets of, for example, a silver compound, and thus it is possible to realize a small and thin scale due by making the wiring narrow, and it is possible to obtain a high quality liquid crystal display device in which unevenness in the electrical properties does not occur.

Third Embodiment

The embodiment described above was formed by using a TFT 30 as a switching element for driving the liquid crystal display apparatus 100, but this can be applied to devices other than the liquid crystal display apparatus, such as an organic EL (electro-luminescent) apparatus. An organic EL display apparatus has a structure in which a thin film that includes a luminescent inorganic and organic compound interposed between a negative electrode and a positive electrode, the device is an element in which excitons are generated by injecting and exciting electrons and holes into the thin film, and light is generated by using a light discharge (luminescence, phosphorescence) when the excitons are recoupled. In addition, on the substrate having this TFT 30, among the luminescent materials used in the organic EL display apparatus elements, a material that presents each of the generated light colors of red, green and blue, that is, a light emitting layer formation material and a material that forms a hole injection/electron transport layer is used as ink, and by patterning each of these, it is possible to fabricate a spontaneous light full color EL apparatus.

The type of organic EL apparatus is also included within the scope of the device (electro-optical apparatus) of the present invention, realizes a small and thin scale, and it is possible to obtain a high quality organic EL apparatus in which unevenness in the electrical properties does not occur.

Figure 12:
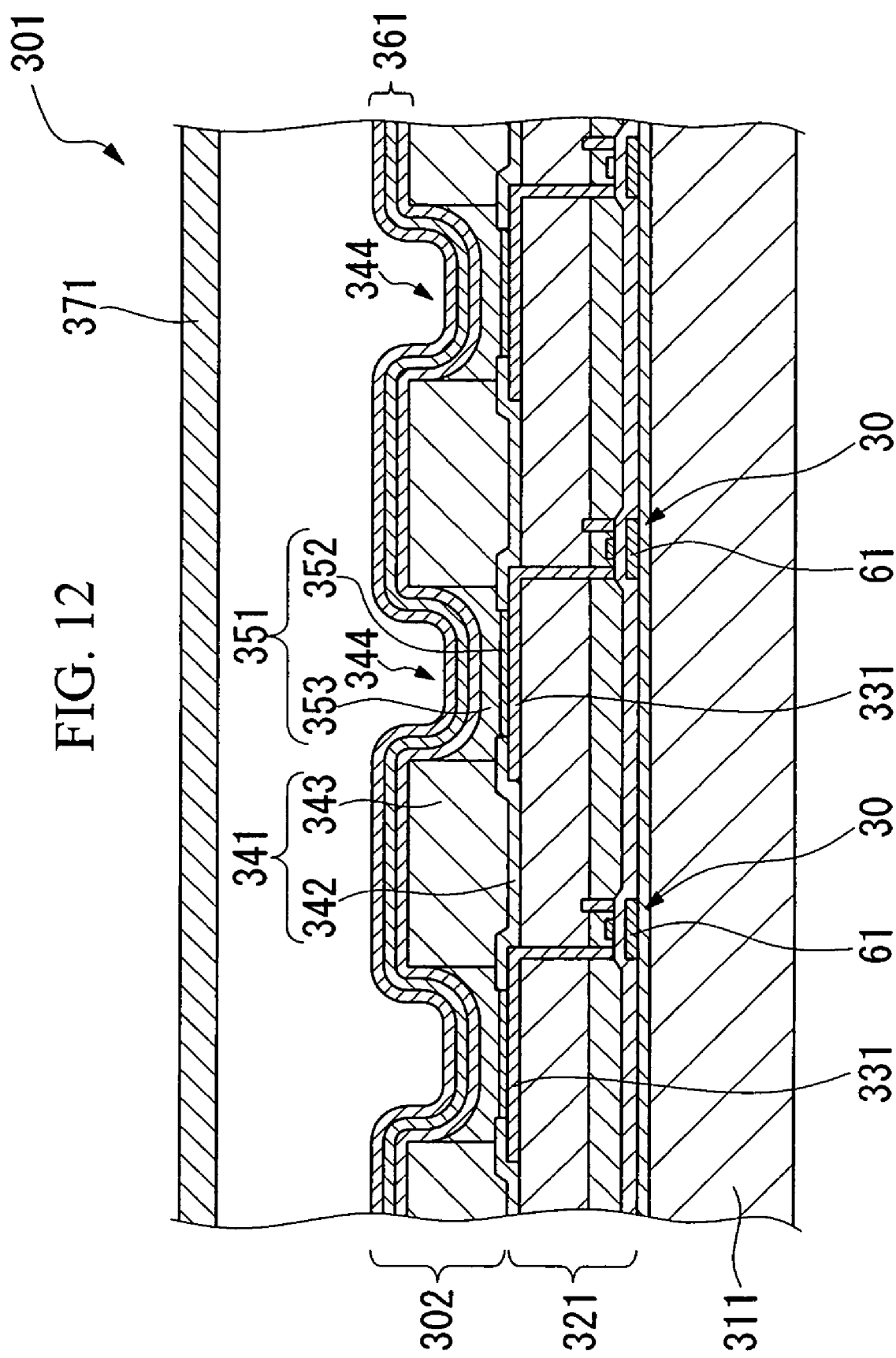
FIG. 12 is a partial enlarged cross-sectional view of the organic EL.

FIG. 12 is a side cross-sectional drawing of the organic EL apparatus, in which a portion of the essential elements is fabricated by the droplet ejection apparatus IJ described above. The schematic structure of the organic EL apparatus will be explained with reference to FIG. 12.

In FIG. 12, in the organic EL apparatus 301, the wiring of a flexible substrate (not illustrated) and a drive IC (not illustrated) are connected to an organic EL element 302 formed by a substrate 311, a circuit element unit 321, a pixel electrode 331, a bank 341, a light emitting element 351, a cathode 361 (opposed electrode), and a sealing substrate 371. The circuit element unit 321 is formed by the TFT 30, which is the active element, being formed on the substrate 311 and a plurality of pixel electrodes 311 being arrayed on the circuit element unit 321. In addition, the gate wiring 61 that forms the TFT 30 is formed by a formation method for a wiring pattern in the embodiment described above.

The banks 341 are formed having a lattice form between each of the pixel electrodes 331, and light emitting elements 351 are formed in the concave opening 344 defined by the banks 341. Note that the light emitting element 351 consist red light emitting elements, green light emitting elements, and blue light emitting elements, and thereby, the organic EL apparatus 301 realizes full color display. The cathode 361 is formed over the entire surface of the banks 341 and the light emitting elements 351, and the sealing substrate 371 is laminated on the cathode 361.

The fabrication process for the organic EL apparatus 301 that includes the organic EL element provides a bank formation step in which banks 341 are formed, a plasma treatment step for appropriately forming the light emitting elements 351, a light emitting element formation step in which the light emitting elements 351 are formed, an opposing electrode formation step in which the cathode 361 is formed, and a sealing step in which the sealing substrate 371 is laminated on the cathode 361.

The light emitting element formation step forms the light emitting element 351 by forming the hole injection layer 352 and the light emitting layer 353 on the concave opening 344, that is, on the pixel electrode 331, and provides a hole injection layer formation step and a light emitting layer formation step. In addition, the hole injection layer formation step consists of a first ejection step in which a liquid material is ejected onto each of the pixel electrodes 331 in order to form the hole injection layer 352 and a first drying step in which the hole injection layer 352 is formed by drying the ejected liquid material. In addition, the light emitting layer formation step consists of a second ejection step in which a liquid material is ejected onto the hole injection layer 352 in order to form the light emitting layer 353 and a second drying step in which the light emitting layer 353 is formed by drying the ejected liquid material. Note that three types of the light emitting layer 353 are formed by materials corresponding to the three colors red, green, and blue as described above, and therefore the second ejection step consists of three steps in which the three respective types of material are ejected.

In the light emitting element formation step, it is possible to use the droplet ejection apparatus IJ described above in the first ejection step in the hole injection layer formation step and in the second ejection step in the light emitting layer formation step.

(Fourth Embodiment)

In the embodiments described above, the gate wiring for the TFT (thin film transistor) is formed by using the pattern formation method according to the present invention, but it is also possible to manufacture the other elements such as the source electrode, the drain electrode, the pixel electrode and the like. Below, the method of manufacturing the TFT will be explained with reference to FIG. 13 to FIG. 16.

Figure 13:
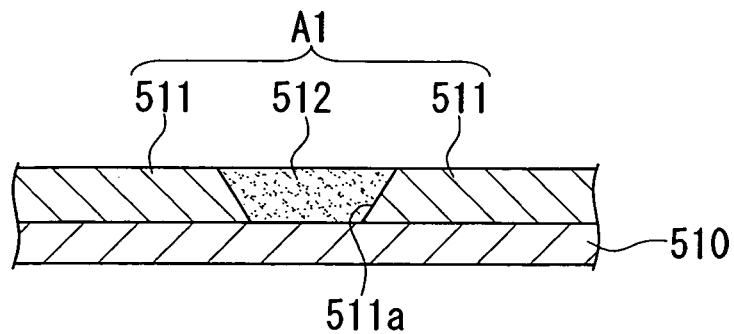
FIG. 13 is a drawing for explaining the steps for manufacturing the thin film transistor.

As shown in FIG. 13, first banks 115 are formed by lithography. These banks 115 are for providing a groove 115a that is ½₀ to ⅟₁₀ the pitch of one pixel on the upper surface of the glass substrate 510 that has been washed. Transparency and a liquid repellent must be provided to the banks 511 after formation, and thus, in addition to a high molecular material such as an acryl resin, a polyimide resin, an olefin resin, a melanin resin or the like, an inorganic material such as poly-silazane can be advantageously used as this material.

In order to provide a liquid repellent to the banks 511 after formation, it is necessary to carry out a $CF_4$ plasma treatment (a plasma treatment in which a gas having a fluoride component has been used), but instead, the material of the banks 511 itself can be filled with a liquid repelling material (a fluorine group or the like) in advance. In this case, the $CF_4$ plasma treatment can be omitted.

The contact angle of the liquid repelling banks 511 with respect to the ejected ink is preferably guaranteed to be 40° or greater, and the contact angle of the glass surface with respect thereto is preferably guaranteed to be equal to or less than 10°. Specifically, as a result of experimental confirmation by the inventors, a contact angle after treatment with respect to, for example, a conductive particle (tetradecane solvent) can be guaranteed to be approximately 54.0° (10° or less when untreated) when using an acryl resin as the material for the banks 511. Note that these contact angles are obtained under treatment conditions in which the plasma power is 550 W and the tetrafluoromethane gas is supplied at 0.1 L(liter)/min.

In the gate scanning electrode formation step (the first conducting pattern formation step) that follows the first bank formation step described above, a gate scanning line electrode 512 is formed by ejecting droplets that include a conducting material using an inkjet so as to fill the groove 511a, which is the drawing area partitioned by the banks 11.

In addition, the formation method for a pattern according to the present invention can be applied when forming the gate scanning electrode 512.

Ag, Al, Au, Cu, palladium, Ni, W-si, conducting polymers and the like can be advantageously used as the conducting material here. The gate scanning line electrode 512 formed in this manner can impart a sufficient liquid repelling property to the banks 511, and thus it is possible to form a fine wiring pattern that does not project from the groove 511a.

Due to the steps described above, on the substrate 510, a first conducting layer A1 can be formed consisting of gold (Ag) that is provided on the flat surface consisting of the bank 511 and the gate scanning electrode 512.

In addition, in order to obtain an advantageous ejection result in the groove 511a, as shown in FIG. 13, preferably a divergent-taper (a tapered profile that opens toward the ejection source) is used as the profile of this groove 511a. Thereby, it becomes possible for the ejected droplet to fill the grooves down to the bottom.

Figure 14:
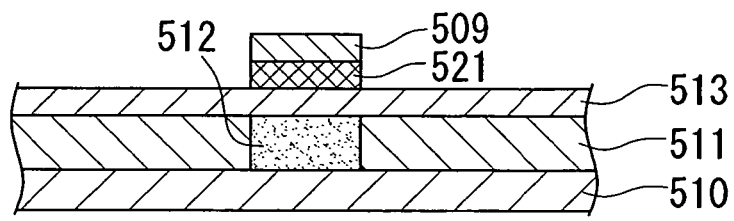
FIG. 14 is a drawing for explaining the steps for manufacturing the thin film transistor.
Figure 15:
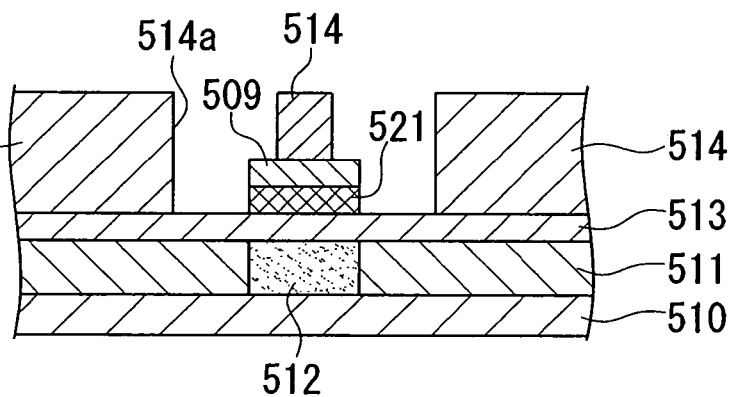
FIG. 15 is a drawing for explaining the steps for manufacturing the thin film transistor.

Next, as shown in FIG. 14, the continuous film formation of the gate insulating layer 513, the active layer 521, and the contact layer 509 is carried out by using a plasma CVD method. By varying the source gas and the plasma conditions, the gate insulation film 513 can be formed by a silicon nitride film, the active film 521 can be formed by an amorphous silicon film film, and a contact film 509 can be formed by a $n^+$ silicon film. In the case of formation using a CVD method, a thermal history of 300° C. to 350° C. is necessary. By using an inorganic material in the banks, it is possible to avoid problems related to transparency and thermal resistance.

In the second bank formation step that follows the semiconductor layer formation step described above, as shown in FIG. 15, second banks 514 are formed based on a lithographic method. These second banks are for providing a groove 514a on the upper surface of the gate insulating film 513 that is ½₀ to ⅟₁₀ the pitch of one pixel and intersects the groove 10a. Transparency and a liquid repelling property must be provided to the banks 514 after formation, and thus in addition to a high molecular material such as an acryl resin, a polyimide resin, an olefin resin, a melanin resin or the like, an inorganic material such as poly-silazane can be advantageously used as this material.

In order to provide a liquid repelling property to the banks 514 after formation, it is necessary to carry out $CF_4$ plasma treatment (plasma treatment in which a gas incorporating a fluoride component is used), but instead, the material of the banks 514 itself can be filled with a liquid repelling material (a fluorine group or the like) in advance. In this case, the $CF_4$ plasma treatment can be omitted.

The contact angle of the liquid repelling banks 514 with respect to the ejected ink is preferably guaranteed to be 40° or greater.

Figure 16:
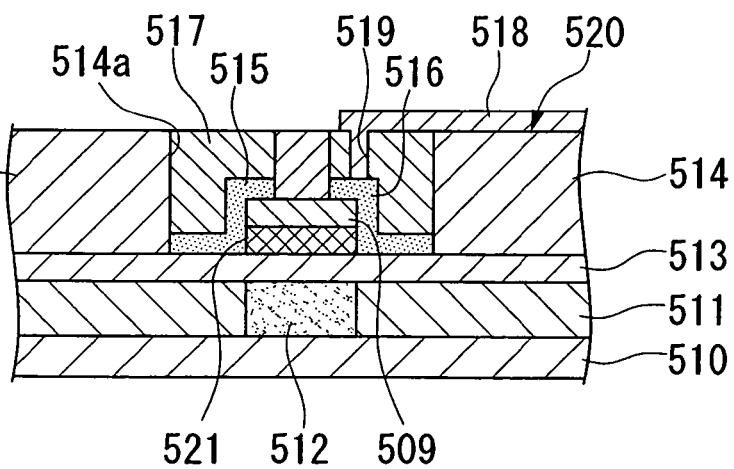
FIG. 16 is a drawing for explaining the steps for manufacturing the thin film transistor.

In the second film source/drain electrode formation step (the second conducting pattern formation step) that follows the second bank formation step described above, droplets that include a conducting material are ejected by using an inkjet so as to fill the interior of the groove 514a, which is the drawing area partitioned by the bank 514. Thereby, as shown in FIG. 16, the source electrode 515 and the drain electrode 516 that intersect the gate scanning line electrode 512 are formed. In addition, the formation method for patterns according to the present invention can be used when the source electrode 515 and the drain electrode 516 are formed.

Ag, Al, Au, Cu, palladium, Ni, W-si, conducting polymers and the like can be advantageously used as the conducting material here. The source electrode 515 and the drain electrode 516 formed in this manner impart a sufficient liquid repelling property to the banks 514, and thus it is possible to form a fine wiring pattern that does not project from the groove 514a.

In addition, the insulating material 517 is disposed so as to fill the groove 514a in which the source electrode 515 and the drain electrode 516 are disposed. By the steps described above, a flat upper surface 520 consisting of the banks 514 and the insulating material 517 is formed on the substrate 510.

In addition, contact holes 519 are formed in the insulating material 517, and at the same time, the pixel electrode (ITO) 518 patterned on the supper surface 520 is formed, the drain electrode 516 and the pixel electrode 518 are connected via the contact hole 519, and thereby the TFT is formed.

Fifth Embodiment

Figure 17:
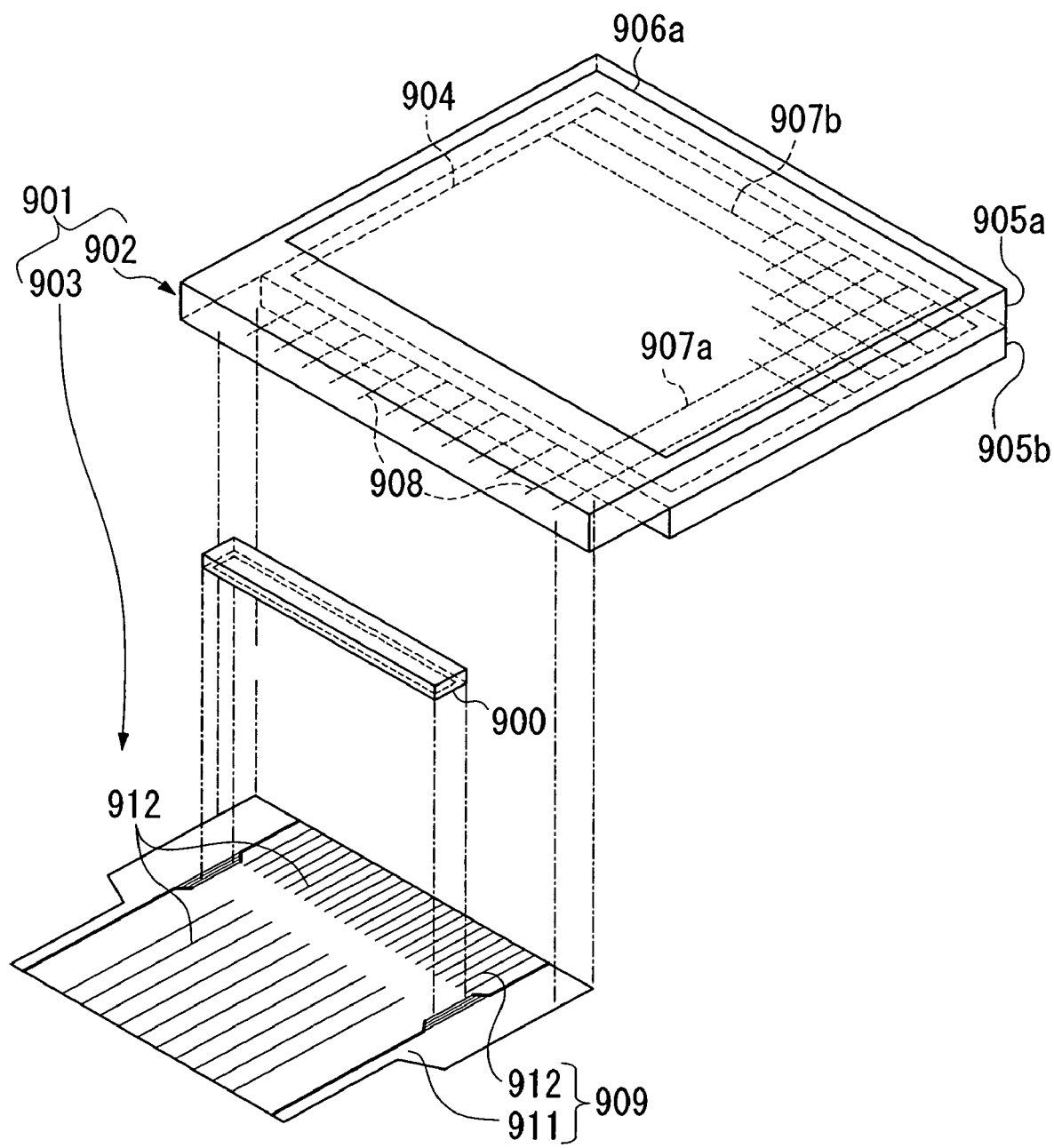
FIG. 17 is a drawing showing another embodiment of the liquid crystal display apparatus.

FIG. 17 is a drawing showing another embodiment of the liquid crystal display apparatus.

The liquid crystal display apparatus (electro-optical apparatus) 901 shown in FIG. 17 broadly provides a liquid crystal panel (electro-optical panel) 902 and a circuit substrate 903 connected to the liquid crystal panel 902. In addition, as necessary, an illuminating apparatus such as a backlight and other accessory devices can be added to the liquid crystal panel 902.

The liquid crystal panel 902 has a pair of substrates 905a and 905b that are attached by the sealing material 904, and a liquid crystal is sealed in the gap formed between these substrates 905a and 905b, which is referred to as a cell gap. These substrates 905a and 905b are generally formed by a light transmitting material, such as glass or a synthetic resin. The polarizing plate 906a and another polarizing plate are attached on the outer surfaces substrate 905a and the substrate 905b. Note that in FIG. 17 the other polarizing plate has been omitted.

In addition, the electrodes 907a are formed on the inner surface of the substrate 905a, and the electrodes 907b are formed on the inner surface of the substrate 905b. These electrodes 907a and 907b are formed into an appropriate pattern such as a stripe shape, a letter, number, or other pattern. In addition, these electrodes 907a and 907b are formed by a transparent material such as ITO (indium tin oxide). The substrate 905a has an overhanging part that hangs over the substrate 905b, and a plurality of terminals 908 are formed on this overhanging part. These terminals 908 are formed at the same time that the electrodes 907a are formed on the substrate 908a. Therefore, these terminals 908 are formed by, for example, ITO. These terminals 908 include ones that extend integrally from the electrodes 907a and ones that are connected to the electrodes 907b via a conducting material (not illustrated).

On the circuit substrate 903, the semiconductor elements 900 that serve as the liquid crystal drive ICs are mounted at predetermined locations on the wiring substrate 909. Note that although not illustrated, resistors, capacitors, and other chip elements can be mounted at predetermined locations at sites outside the sites where the semiconductor elements 900 are mounted. The wiring substrate 909 is fabricated by forming a wiring pattern 912 by patterning a metal film such as Cu formed on a flexible film base substrate 911 made, for example, of polyimide.

In the present embodiment, the electrodes 907a and 907b in the liquid crystal panel 902 and the wiring pattern 912 in circuit substrate 903 are formed by a device fabrication method.

According to the liquid crystal display apparatus of the present embodiment, it is possible to obtain a high quality liquid crystal display apparatus that realizes downsizing and thinning.

Note that the example described above is a passive liquid crystal panel, but the embodiment can also be used with an active matrix liquid crystal panel. Specifically, the thin film transistor (TFT) is formed on one substrate and pixel electrodes are formed for each TFT. In addition, it is possible to form the wiring (gate wiring, source wiring) electrically connected to each TFT by using the inkjet technology described above. At the same time, opposing electrodes and the like are formed on the opposing substrate. It is possible to apply the present invention to such an active matrix liquid crystal panel.

Sixth Embodiment

Next, a plasma display apparatus, which is one example of the electro-optical apparatus of the present invention, will be explained as a sixth embodiment.

Figure 18:
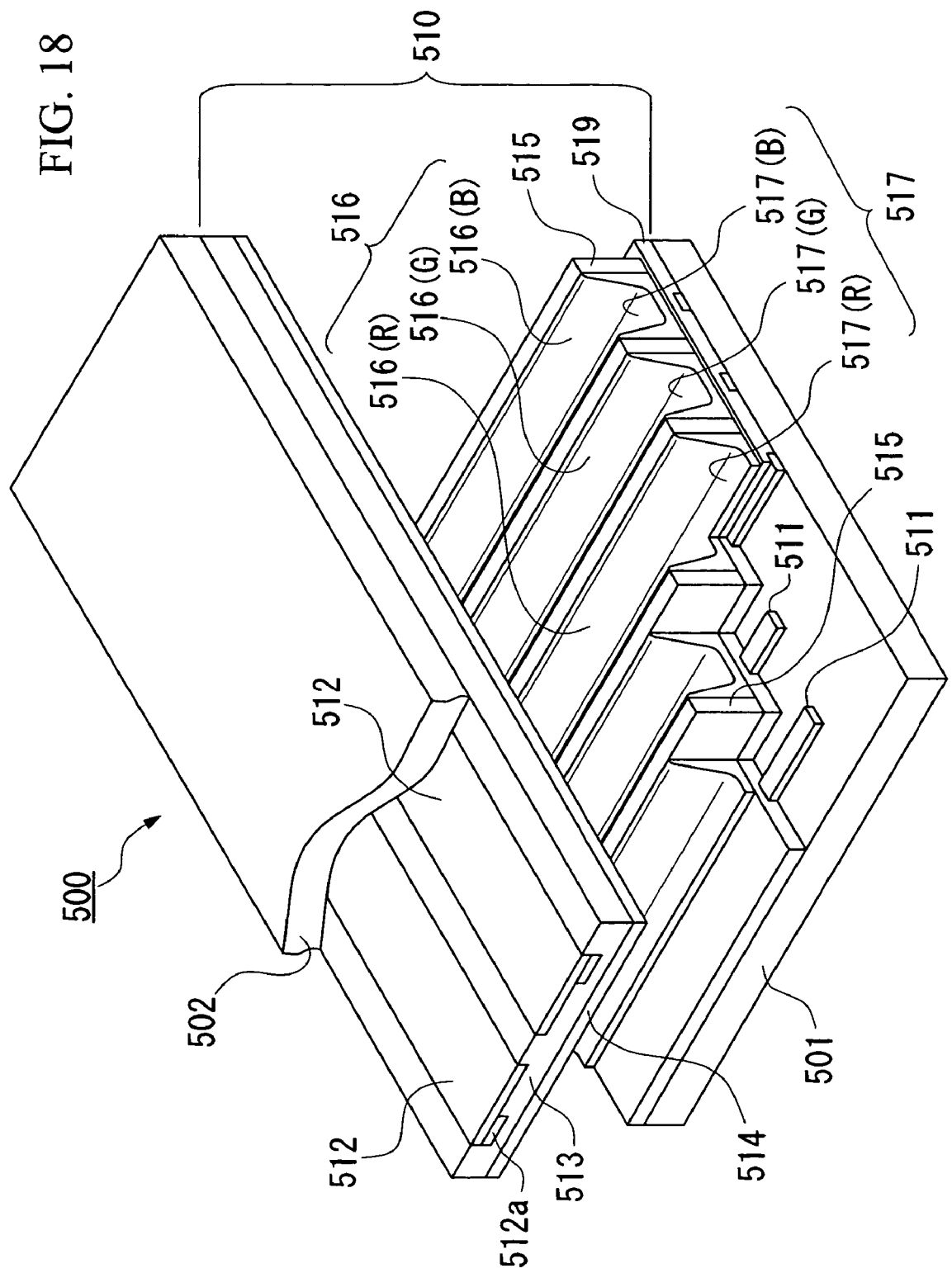
FIG. 18 is an exploded perspective view of a plasma display apparatus.

FIG. 18 shows an exploded perspective drawing of the plasma display apparatus 500 of the present embodiment.

The plasma display device 500 is formed consisting substrates 501 and 502 disposed opposite to each other and a discharge display 510 that is formed therebetween.

The discharge display apparatus 510 is a collection of a plurality of discharge chambers 516. Among the plurality of discharge chambers 516, three discharge chambers 516, consisting of a red discharge chamber 516 (R), a green discharge chamber 516 (G), and a blue discharge chamber 516 (B), are paired and disposed so as to form one pixel.

Stripe shaped address electrodes 511 are formed at predetermined intervals on the upper surface of the substrate 501, and an dielectric film 519 is formed so as to cover the upper surface of the address electrode 511 and the substrate 501.

A barrier 515 is formed on the dielectric film 519 positioned between the address electrodes 511 and 511 and along each of the address electrodes 511. The barrier 515 includes a barrier adjacent to both the left and right sides in the width direction of the address electrodes 511 and a barrier extending in a direction perpendicular to the address electrodes 511. in addition, a discharge chamber 516 is formed that corresponds to the rectangular region partitioned by the barrier 515.

In addition, a fluorescent material 517 is disposed inside the rectangular region partitioned by the barrier 515. The fluorescent material 517 emits either a red, green, or blue fluorescent light. The red fluorescent material 517 (R) is disposed at the bottom of the red discharge chamber 516 (R), the green fluorescent material 517 (G) is disposed at the bottom of the green discharge chamber 516 (G), and the blue fluorescent material 517 (B) is disposed at the bottom of the blue discharge chamber 516 (B).

At the same time, a plurality of display electrodes 512 are formed in a direction perpendicular to the above address electrodes 511 separated by a stripe shaped predetermined gap. Furthermore, a dielectric film 513 and a protective film 514 consisting of MgO or the like is formed so as to cover these.

The substrate 501 and substrate 502 are fastened together in opposition such that the address electrodes 511 and the display electrodes 512 are mutually perpendicular.

The address electrodes 511 and the display electrodes 512 described above are connected to an alternating current source (not illustrated). By passing a current through each of the electrodes, the fluorescent material 517 in the discharge display units 510 becomes excited and luminescent, and color display becomes possible.

In the present embodiment, the address electrodes 511 and the display electrodes 512 are each formed by the device fabrication method described above, and thereby it is possible to realize downsizing and thinning, and thereby it is possible to obtain a high quality plasma display apparatus in which unevenness in the electrical properties does not occur.

Seventh Embodiment

Figure 19:
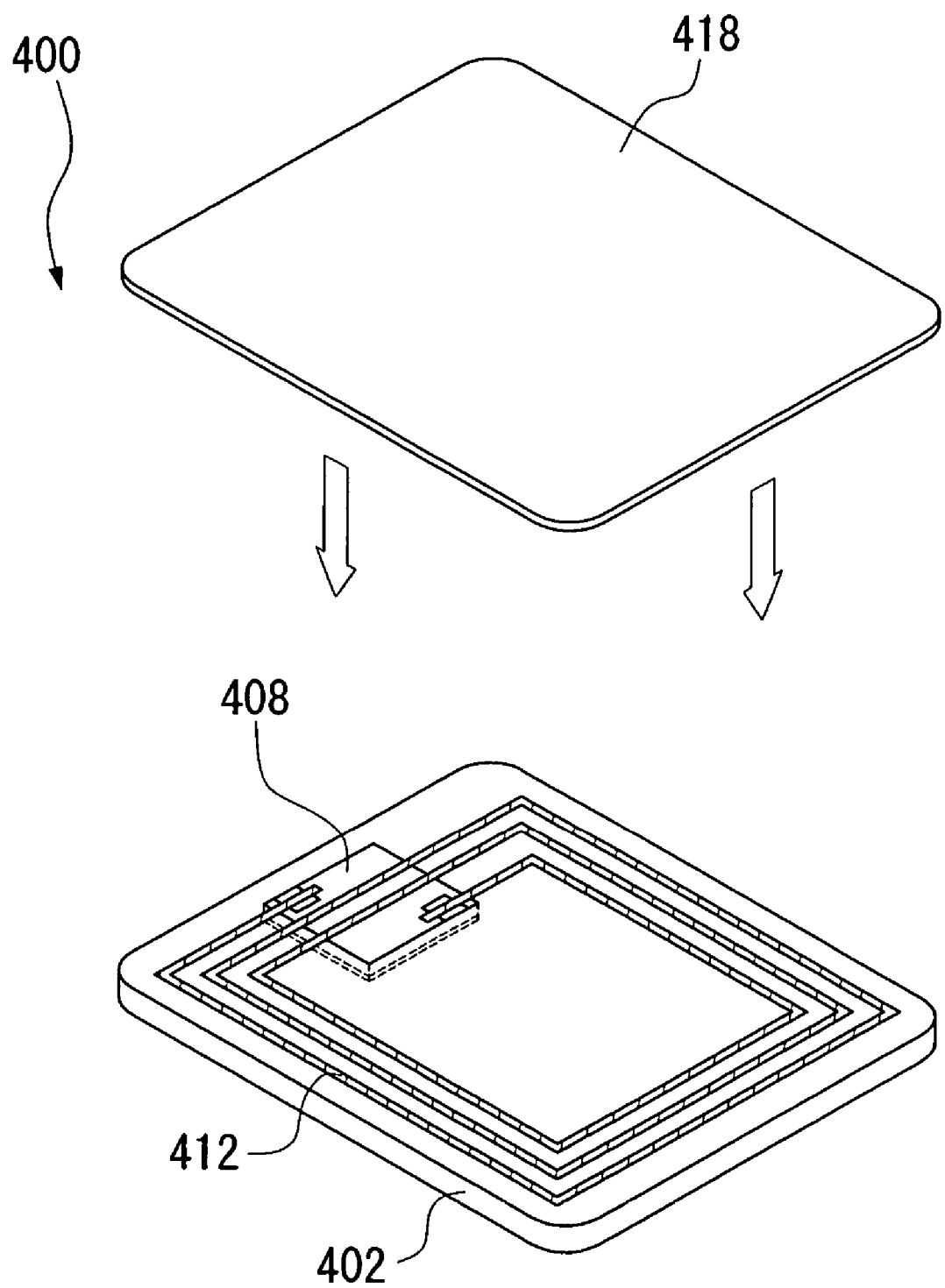
FIG. 19 is an exploded perspective view of a non-contact type card medium.

Next, an embodiment of a non-contact card medium will be explained as a seventh embodiment. As shown in FIG. 19, the non-contact card medium (electrical device) 400 according to the present embodiment has a semiconductor integrated circuit chip 408 and an antenna circuit 412 built into a case consisting of a card body 402 and a card cover 418, and carries out at least one of power supply and data exchange by at least either electromagnetic or electrostatic capacitance coupling with an external transmitter-receiver (not illustrated).

In the present embodiment, the above antenna circuit 412 is formed by the device manufacturing method according to the embodiment described above.

According to the non-contact card medium of the present embodiment, downscaling and thinning are realized, and it is possible to obtain a high non-contact card medium in which irregularities in the electrical properties does not occur.

Note that in addition to the examples described above, by causing the current to flow to the small-area thin film formed on the substrate parallel to the film surface, a device (electro-optical apparatus) according to the present invention can be applied to a surface-conduction electron-emitter or the like, which exploits the phenomenon in which electron discharge occurs.

Eighth Embodiment

Concrete examples of electronic apparatuses of the present invention will be explained as an eighth embodiment.

Figure 20A:
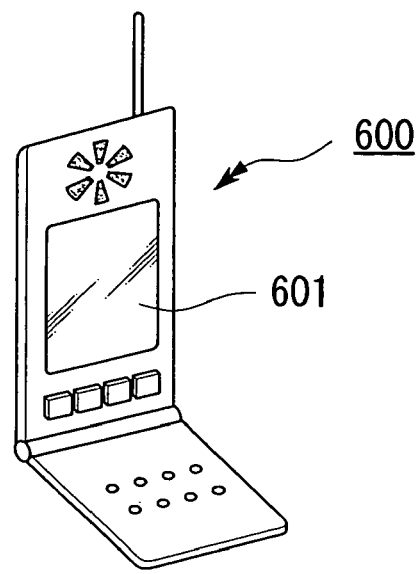
FIG. 20A to FIG. 20C is a view showing a concrete example of an electronic apparatus of the present invention.

FIG. 20A is a perspective drawing showing an example of a cellular telephone. In FIG. 20A, reference numeral 600 denotes a cellular telephone body, and 601 denotes that liquid crystal display unit that provides the liquid crystal display apparatus of the embodiment described above.

Figure 20B:
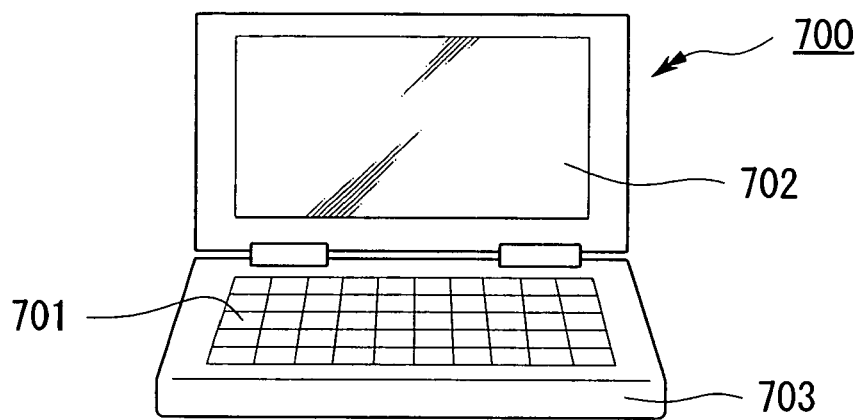

FIG. 20B is a perspective drawing showing an example of a portable information processing device such as a word processor or personal computer. Reference numeral 700 denotes an information processing apparatus, 701 denotes an input unit such as a keyboard, reference numeral 703 denotes an information processing unit, and 702 denotes a liquid crystal display unit that provides the liquid crystal display device of the embodiment described above.

Figure 20C:
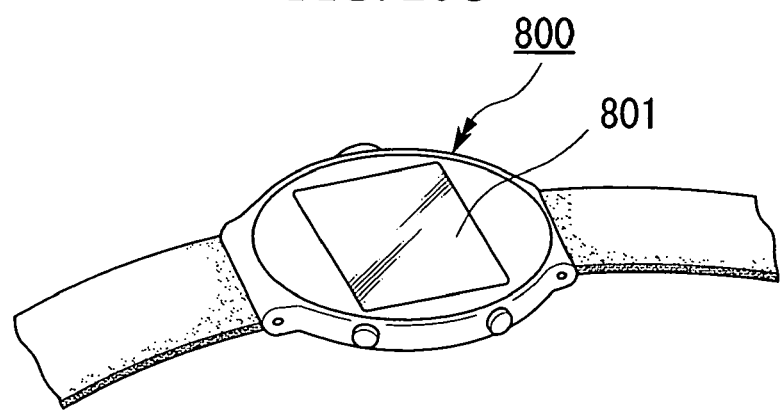

FIG. 20C is a perspective drawing showing an example of an electrical wristwatch. In FIG. 20C, reference numeral 800 denotes the watch body, and 801 denotes the liquid crystal unit that provides the liquid crystal display apparatus of the embodiment described above.

The electronic apparatuses shown in FIGS. 20A to 20C provide the liquid crystal display device of the embodiments described above, and thus can be downsized, thinned, and have a high quality imparted.

Note that the electronic apparatus of the present embodiment provides a liquid crystal apparatus, but it is possible to use an electronic apparatus that provides another electro-optical apparatus such as an organic electro-luminescent display apparatus, a plasma display apparatus or the like.

Above, suitable embodiments according to the present invention were explained with reference to the attached drawings. However, the present invention is not limited thereby. The shapes, combinations and the like of each of the essential elements shown in the examples described above are examples, and various changes based on the design requirements within a range that does not depart from the spirit of the present invention are possible.

For example, in the embodiments described above, a structure was used in which the dummy pattern DP is formed between the banks B2. However, this is not limiting. A structure can be used in which the dummy pattern DP is wired without forming the banks B2 in the dummy region PO. Furthermore, it is not necessary to wire the dummy pattern using a single line. The pattern can consist of a plurality of points disposed with a gap therebetween.

Figure 3B:
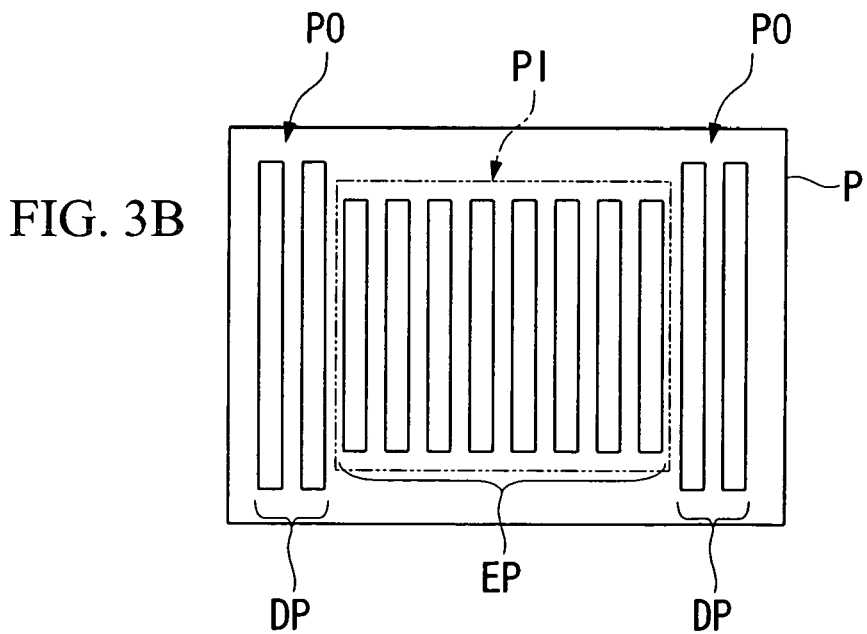

In addition, in the embodiments described above, a structure was used in which the dummy pattern DP was formed in line with the arrangement specifications of the electrode pattern EP. However, this is not limiting. The dummy pattern DP can be formed using different arrangement specifications. In addition, in the embodiments described above, in FIG. 3A for example, the electrode pattern EP and the dummy pattern DP were formed having the same length, but this is not limiting. As shown in FIG. 3B, a structure in which the dummy pattern DP is formed having a length that projects farther than the each of the edges of the electrode pattern EP in the lengthwise direction.

In this case, with respect to the length direction of the electrode pattern, it becomes possible to ameliorate unevenness in the drying of the electrode pattern and make the film thickness constant.

Furthermore, in the embodiments described above, a structure in which the electrode pattern EP was arranged at a constant pitch was explained, but a structure can be used in which the electrode pattern EP is arranged using a plurality of mutually differing pitches. In this case, preferably the dummy pattern DP is formed at a pitch that is the average of this plurality of pitches. Thereby, it is possible to prevent the solvent vapor density between the electrode patterns from becoming uneven.

In addition, a second conductive film formed in the embodiment described above was explained as being a dummy film. However, this is not limiting. By providing a connection terminal at the edge, it is also possible to use the second conducting film as connecting wiring that is different from the electrode pattern.

Furthermore, it is not always necessary to form the conducting film and the second conducting film using identical materials, and a structure can be used in which they are formed from different materials.

In addition, in the embodiments described above, a structure was used in which a functional liquid consisting of a dispersion liquid in which conducting particles are dispersed in a dispersion medium. However, this is not limiting. For example, a material that exhibits conductivity due to heat treatment by heat after pattern formation, or due to light treatment such as irradiation.

What is claimed is:

1. A device comprising:
a substrate;
banks formed on the substrate;
a conductive film formed by droplet ejection onto a predetermined pattern formation region in a groove between the banks; and
a second conductive film formed by droplet ejection disposed outside the predetermined pattern formation region that remains electrically separated from the conductive film,
wherein both of the conductive films are disposed in substantially the same plane.

2. A device according to claim 1, wherein the second conductive film is formed in the groove between the second banks formed outside the pattern formation region.

3. A device according to claim 2, wherein at least one of the banks and the second banks have a liquid repellency which is higher than a liquid repellency of the groove therebetween.

4. A device according to claim 1, wherein the secofid conductive film is formed by a material that is identical to that of the conductive film.

5. A device according to claim 1, wherein the second conductive film is arranged substantially identically to the conductive film and formed continuously.

6. A device according to claim 1,
wherein the conductive film is arranged at a plurality of differing pitches, and
the second conductive film is arranged at a pitch that is the average of the plurality of pitches.

7. A device according to claim 1, wherein the second conductive film is formed having a length that projects from both edges of the conductive film in the longitudinal direction of the conductive film.

8. A device according to claim 1, wherein the edge of the second conductive film is a connecting terminal.

9. A device according to claim 1, wherein the droplets contain metal particles.

10. A device according to claim 1, wherein the droplets include a material that exhibits conductivity due to heating or irradiation.

11. An electro-optical apparatus comprising the device according to claim 1.

12. An electric apparatus comprising the electro-optical apparatus according to claim 11.

* * * * *